United States Patent [19]
Song

[11] 3,937,897
[45] Feb. 10, 1976

[54] SIGNAL CODING FOR TELEPHONE COMMUNICATION SYSTEM

[75] Inventor: Ching-Long Song, Columbus, Ohio

[73] Assignee: North Electric Company, Galion, Ohio

[22] Filed: July 25, 1974

[21] Appl. No.: 491,767

[52] U.S. Cl............ 179/15 AP; 325/38 B; 332/11 D
[51] Int. Cl.² ................... H03K 11/00; H03K 13/22
[58] Field of Search............ 325/38 B, 42, 44, 141; 340/347 DD, 347 DA, 347 AD; 332/11 D; 179/15 AP, 2 DP; 178/68

[56] References Cited
UNITED STATES PATENTS

| | | | |
|---|---|---|---|
| 3,231,674 | 1/1966 | Boyer et al. .................... | 179/15 AP |
| 3,633,170 | 1/1972 | Jones............................... | 325/38 B |
| 3,638,219 | 1/1972 | Harms............................. | 325/38 B |
| 3,652,957 | 3/1972 | Goodman ....................... | 332/11 D |
| 3,707,712 | 12/1972 | Deschenes et al............. | 179/15 AP |
| 3,750,144 | 7/1973 | Bolus et al. ..................... | 325/38 B |
| 3,831,092 | 8/1974 | Greefkes......................... | 325/38 B |

Primary Examiner—Thomas A. Robinson
Attorney, Agent, or Firm—Johnson, Dienner, Emrich & Wagner

[57] ABSTRACT

A telephone communication system reversibly converts input signals into adaptive delta modulated (hereafter ADM) signals and then into pulse code modulated signals. In one embodiment, a path for sending signals from a subscriber switch to a central office of a telephone communication system receives analog signals, for example voice signals, in a comparator which also receives an analog signal from an integrator for periodically providing ADM signals. The ADM signals are provided to means responsive to patterns of the ADM signals for providing a pattern controlled signal to the integrator which then generates the analog signal compared with input signal for forming the ADM signals. The ADM signals are also transmitted to digital means detecting the patterns of the ADM signals and responsive to each ADM signal and the detected patterns of the ADM signals for providing a linear pulse code modulated (hereafter LPCM) signal representing a signal increment corresponding to that represented by the ADM signal. Each LPCM signal increment is then added to the total of each preceding LPCM signal increment to form LPCM signals representing the input analog signal. The LPCM signals are then periodically sampled and each sampled LPCM signal converted into a corresponding compressed pulse code modulated (hereafter CPCM) signal for switching and further transmission. In a receiving path of the embodiment a converter converts input CPCM signals into LPCM signals. Each LPCM signal together with a locally generated signal representing the preceding LPCM signal is provided to a digital comparator which forms an ADM signal encoded in response to the relative magnitudes of the input and generated LPCM signals. The ADM signals are then provided to further means controlled by patterns of the ADM signals for providing a pattern controlled signal to an integrator which integrates the pattern controlled signal into an analog signal corresponding to the CPCM signal input to the receiving path of the embodiment.

29 Claims, 17 Drawing Figures

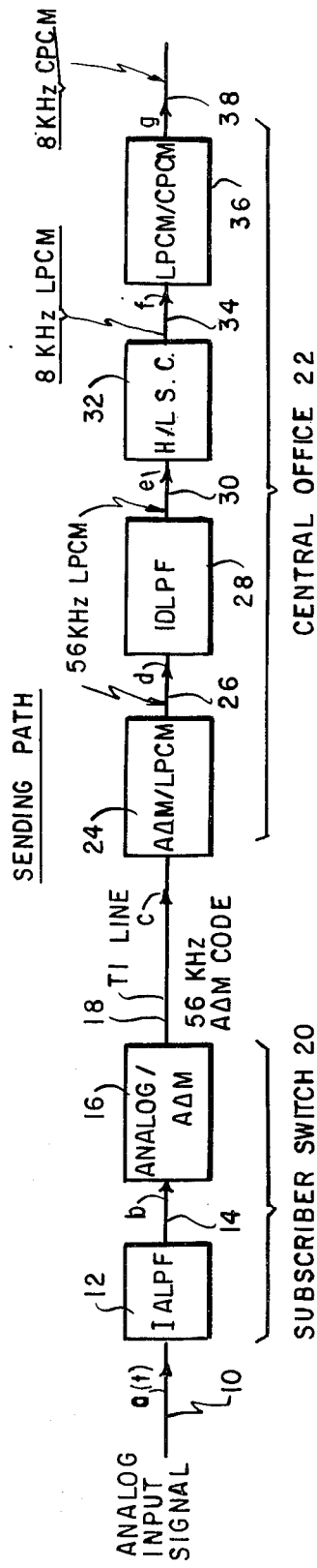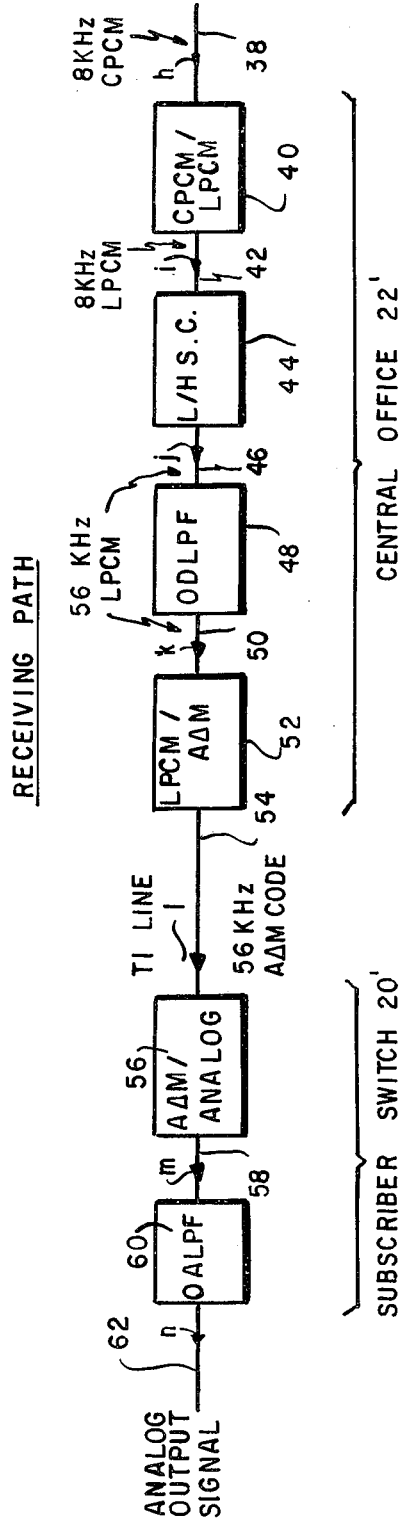

ANALOG/AΔM CONVERTER 16

AΔM/LPCM CONVERTER 24

SPECTRUMS FOR THE FORWARD PATH

LPCM/AΔM CONVERTER 52

AΔM / ANALOG CONVERTER 56

SPECTRUMS FOR THE RETURN PATH

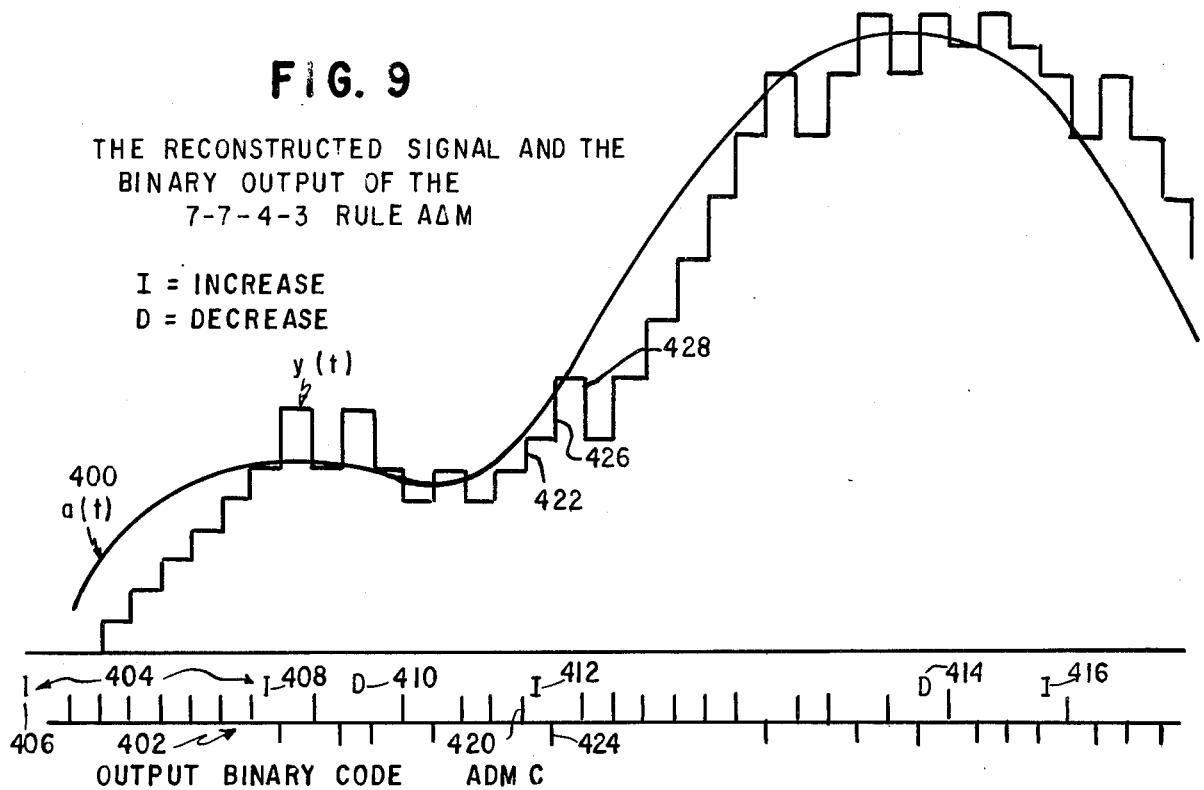
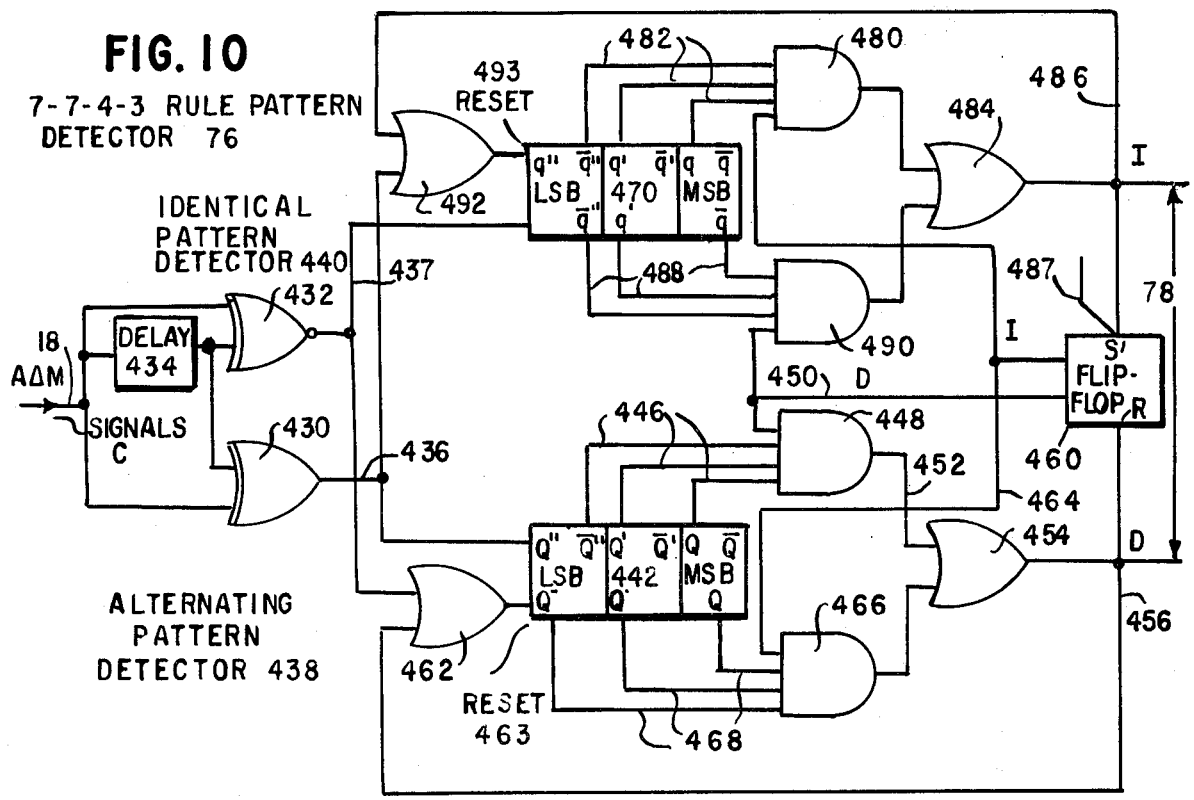

THE RECONSTRUCTED SIGNAL AND
THE BINARY OUTPUT OF 3-3-3-3 RULE AΔM

OUTPUT BINARY CODE ADM SIGNALS c(t)
I ≡ INCREASE
D ≡ DECREASE

OUTPUT BINARY CODE ADM SIGNALS c(t)

3-3-3-3 RULE PATTERN DETECTOR 76

THE RECONSTRUCTED SIGNAL AND
THE BINARY OUTPUT OF 2-2-2-2 RULE AΔM

OUTPUT
I = INCREASE
D = DECREASE

ADM. SIGNALS c(t)

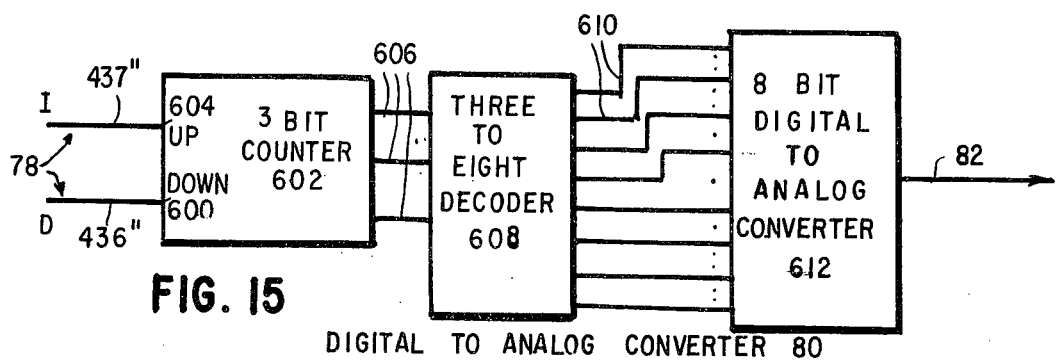
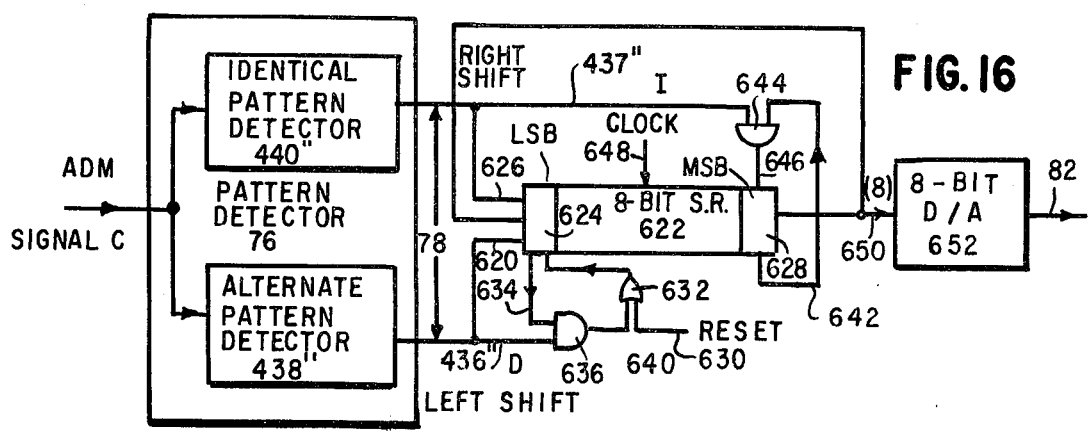
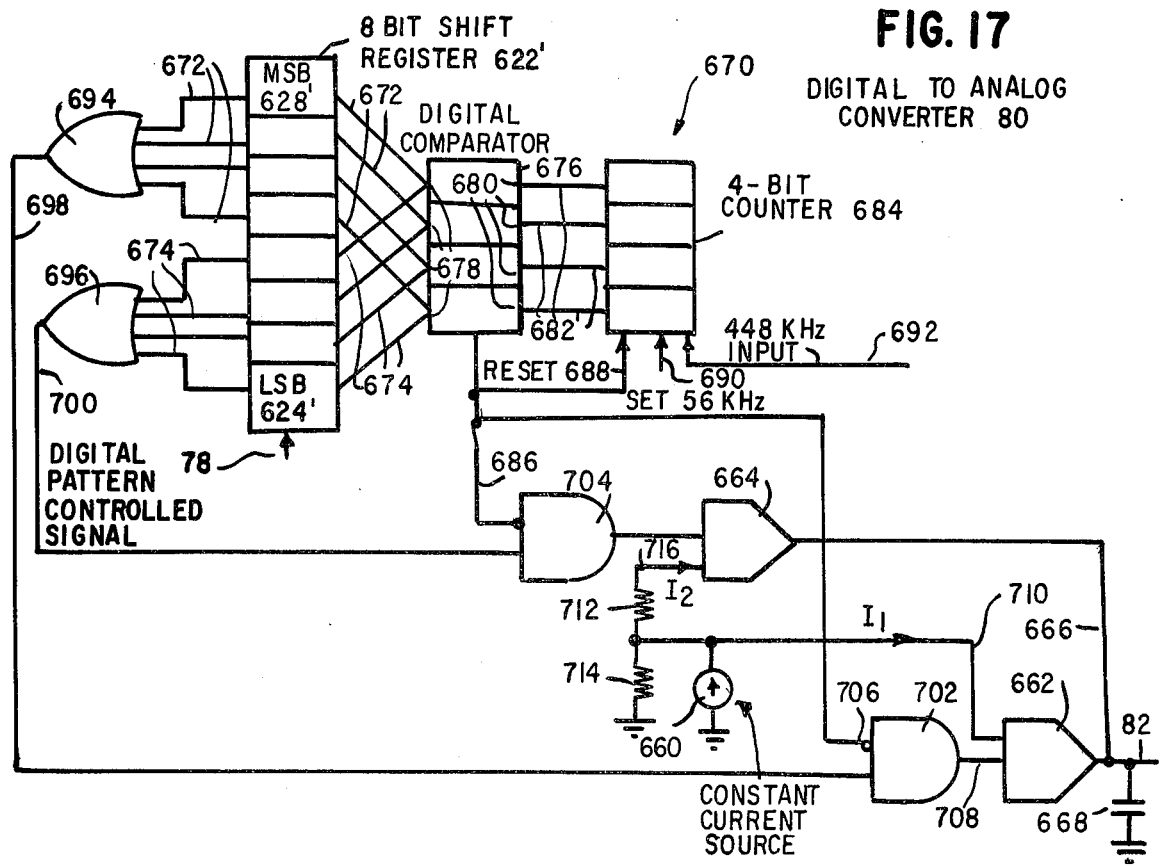

SIGNAL CODING FOR TELEPHONE COMMUNICATION SYSTEM

BACKGROUND OF THE INVENTION

This invention relates to a communication system and, more particularly, to a telephone communication system having adaptive delta modulated (hereafter ADM) signals.

The demand for communication services has been steadily increasing. In meeting this demand, it has proven effective in some communication systems to convert signals presented to the system into encoded digital signal, and then reconvert the encoded digital signals into signals corresponding to those originally input into the system. One example of a communication system in which such transmission of encoded digital signals has proven to have particular utility is a telephone communication system. Several schemes for digitally encoding signals in a telephone system are known. Although these encoding schemes are useful for both digital and analog signals input to the telephone system, they have particular utility with continuous input, time-varying analog signals such as voice signals.

In one encoding scheme, the amplitude of a voice signal is periodically sampled and each sample converted into a digitally encoded pulse sequence or word representing a quantum of analog signal amplitudes including that of the sampled signal. This operation is called sampling and quantizing the analog signal. If the range of analog signal amplitudes represented by each quantum level or step of the quantizing operation is uniform for all analog signal amplitudes, the encoded signal is said to be linear pulse code modulated (hereafter LPCM). Each LPCM signal word may then be decoded to form an analog signal of an amplitude substantially corresponding to the amplitude of the analog signal sample encoded into the LPCM signal word. Since the input analog signal was periodically sampled, the resulting, periodic LPCM signal words may be formed into a continuous analog signal substantially corresponding to the continuous input analog signal.

In the quantizing process, the exact level of the input analog signal at the sampling instant is, as described, approximated by one of a number of discrete values or quantum levels digitally encoded as the LPCM signal. The difference between the instantaneous amplitude of the input analog signal and the quantum level actually transmitted is called quantizing error and gives rise to what is variously known as quantizing noise or quantizing distortion.

Quantizing distortion is especially objectionable and very often intolerable when the instantaneous amplitude of the input analog signal is small, but is usually of little or no significance when the instantaneous amplitude of the input analog signal is high because the low amplitude of the input signals permits a relatively low level of quantizing noise to significantly degrade the ratio of signal to noise while a higher amplitude of the input signal can tolerate greater quantizing noise within an acceptable ratio of signal to noise. It is therefore desirable to have smaller quantum levels for lower amplitudes of the input signal to achieve closer correspondence between the quantum level of the encoded signal and the actual amplitude of the input analog signal at lower amplitudes of the input signal than for higher amplitudes of the input signal. Of course the size of the quantum levels for all input signal amplitudes could be decreased, but this produces an undesirable increase in the total number of quantum levels, requiring, for example, more binary bits to represent the signal as a digitally encoded word.

The suggested non-linear redistribution of the size of the quantizing levels is called companding, a verbal contraction of the terms compression and expanding. The purpose of companding is then to reduce the quantizing impairment of the original signal without unduly increasing the total number quantizing levels by quantizing on a non-linear rather than a linear basis.

It is current practice with telephone systems to compand encoded analog signals on either a "mu-law" or an "A-law" companding scheme as described by H. Kaneko in an article entitled "A Unified Formulation of Segment Companding Laws and Synthesis of Codecs and Digital Companders," *Bell System Technical Journal*, September, 1970. Both these laws define segments or chords of a piecewise linear curve generally exponentially increasing for increasing levels of input analog signal amplitude. Each chord is divided into an equal number of quantization steps defining between them the intervals or quantization levels into which the analog signal will be encoded. The companding encoding scheme is then to encode each sampled analog signal amplitude into a combined sequence of two encoded signals, one representing the chord generally corresponding to the analog signal amplitude and the other representing the step along the identified chord more precisely corresponding to the analog signal amplitude. The resulting signals are then called compressed pulse code modulated signals (hereafter CPCM) or companded pulse code modulated signals. One device for so encoding input analog signals is disclosed in co-pending U.S. Pat. application Ser. No. 385,095 filed Aug. 2, 1973 in the names of Wintz, Sergo and Song. Of course, CPCM signals may also be decoded into an analog signal. One device for so decoding CPCM signals is disclosed in co-pending U.S. Pat. application Ser. No. 402,342 filed Oct. 1, 1973 in the names of Wintz and Sergo.

Still another scheme for encoding analog signals periodically samples the analog signal and compares the amplitude of the signal at each sampling instant with a signal representing the predicted amplitude of the analog signal from the immediately preceding sampling instant to form a binary-encoded signal from the comparator indicating by its one of the two possible binary states whether the instant sample of the analog signal is greater or less than the sample at the preceding instant. In general, the signal from the comparator is integrated to locally generate a signal representing the amplitude of the analog signal at the preceding sampling instant for comparison in the comparator with the instantaneous sample of the analog signal. Then, for example, if the input analog signal is greater at one sampling instant than the locally generated signal representing the amplitude of the analog signal at the immediately preceding sampling instant, the comparator provides a high logic level signal, and, if the input signal is less than the locally generated signal, the comparator provides a low logic level signal. Such binary-encoded, single-bit signals are called linear delta modulated (hereafter LDM) signals.

The effectiveness of such LDM signals in representing analog signals largely depends upon the accuracy of the locally generated signal in representing the preceding sample of the analog signal. It has been shown that the relative accuracy of the locally generated signal may be maximized by keeping the sampling rate high and the increments or quantizing steps in locally generating the signal representing the preceding analog signal relatively small to thereby provide a large number of LDM signals representing quantum levels or steps of an analog signal closely approximating the preceding signal sample so that the quantizing error in encoding an individual LDM signal will not represent a substantial excursion of the LDM signal from the actual input analog signal. Unfortunately, the sampling rates required to achieve the same quality or signal to noise ratio and dynamic range from such LDM signals in comparison to a similar signal encoded in a 7-bit mu=255 CPCM scheme is 19.6 MHz and, in an 8-bit scheme, 39.2 MHz, frequencies substantially at the limit of modern digital technology.

Nevertheless, the relative simplicity of the LDM encoding scheme makes desirable the use of this scheme in telephone equipment, particularly telephone equipment between a subscriber and a central office which generally is not now digitally encoded. Given the large number of telephone subscribers, the simplicity and thus potentially lower cost of delta modulation equipment as compared to equipment providing CPCM signals offers economic attraction for the introduction of delta modulation devices into a telephone system. However, achieving the high frequencies required for LDM signals of a quality equivalent to CPCM signals requires expensive, high-speed digital devices. In addition, the uncontrolled environment at the location of subscriber equipment makes such high-speed devices unreliable.

One solution to the high sampling frequencies required in the LDM signal encoding scheme is disclosed in co-pending U.S. Pat. application Ser. No. 482,380 filed June 24, 1974 in the name of Song. The communication system disclosed in this application has a uniform finite impulse response filter for accumulating and sampling LPCM signals converted from input LDM signals. With this digital filter it may be theoretically demonstrated that mu=255, 7-bit CPCM quality signals may be achieved from 8 MHz LDM signals instead of the 19.6 MHz LDM signals required without the filter, and mu=255, 8-bit CPCM quality signals may be achieved from 16 MHz LDM signals instead of the 39.2 MHz.

Since the effectiveness of delta modulation in representing analog signals also depends upon the size of the quantizing levels or steps in locally generating the signal representing the preceding analog signal, attempts have also been made to vary the step size in locally generating the signal representing the analog signal at the preceding sampling instant. In general similarity to the described CPCM signal companding scheme, the delta modulation step size is made smaller for ADM signals representing lower amplitude analog signals than for ADM signals representing higher amplitude analog signals. This technique is usually called adaptive delta modulation. Signals encoded in such a scheme are then called adaptive delta modulated (hereafter ADM-)signals.

Several proposals for implementing ADM signal encoding schemes are reviewed in an article by H. R. Schindler, "Delta modulation," *IEEE spectrum*, October, 1970. As described in this article, one early proposal doubles the quantization step size of an integrator which locally generates an analog signal which is compared with the input signal to form the ADM signals in response to two consecutive ADM signals of identical logic state and halves the step size in response to two consecutive ADM signals of alternate logic state. This proposal then uses patterns of identical or alternating logic states of two consecutive ADM signals to control integration step sizes. Control of integration step size, being an analog procedure, is difficult to stabilize.

Other proposals continuously monitor an input analog signal to generate, in addition to ADM signals, a signal describing the quantization step size represented by the ADM signals. Both signals are then transmitted to a detector which continuously applies the step describing signal to the successive ADM signals to generate an analog signal on which the increment represented by each ADM signal forming the analog signal is controlled by the separately transmitted signal. Such double signal transmission substantially defeats the attractive simplicity of the ADM signal encoding scheme.

U.S. Pat. No. 3,500,441 issued in the name of Brolin discloses another device for creating ADM signals from input analog signals. This device is similar to that just described in that the size of integration steps represented by each ADM signal determined in direct response to changes in the input analog signal and the determined integration step size represented by a signal distinct frm the ADM signal. However, in this device the distinct step signal is digitally encoded and time division multiplexed with the ADM signal for transmission to a decoder. The decoder then demultiplexes the two signals to control integration of the ADM signal with the distinct, digital step signal. Again, such double signal transmission substantially defeats the attractive simplicity of the ADM signal encoding scheme.

Another proposal for an ADM signal encoding scheme attempted to avoid the undesirable double signal transmission with a return to the concept of the above described early proposal in which the successive ADM signals themselves carry information indicating the analog increment represented by each ADM signal while, at the same time, retaining continuous control of the analog increment represented by each ADM signal. In this proposal the successive ADM signals are rectified into an analog signal which controls the local generation of a second analog signal from each of the successive ADM signals. The second analog signal is then compared with the input analog signal for forming the ADM signals. But, as with the early proposal, the control of one analog signal with another analog signal is difficult to stabilize for consistent control and matching of the characteristics of sending and receiving paths of the system.

Still another proposal has a sequence detector which detects one specific pattern of four consecutive ADM signals of identical logic state and, in response to the detected pattern, generates an analog signal potential which is a successive integral multiple of a constant determined by the logic state of the ADM signals forming the pattern. The analog potential then controls the width of a generated pulse which is therefore an analog time signal. The pulse then controls the duty cycle of a single current source driving an integrator which forms another analog signal which is compared with the input signal for forming the ADM signals. The analog signal increments represented by these ADM signals are theoretically logarithmically related but this proposal again teaches the difficult to stabilize analog control of an analog signal.

Other patterns of ADM signals for determining the increment of an analog signal represented by each ADM signal are discussed in "Adaptive Delta Modulation With a One Bit Memory," N. S. Jayant, *Bell System Technical Journal*, March, 1970. One specific pattern, later described by the 7-7-4-3 rule, was empirically developed by T. H. Daugherty as reported in "Digitally Companded Delta Modulation for Voice Transmission," 1970 IEEE Circuit Theory Symposium.

U.S. Pat. No. 3,652,957 issued in the name of Goodman discloses another device for implementing an ADM signal encoding scheme in which analog signals are first converted at a high sampling rate into high-speed LDM signals and the high-speed LDM signals then converted in a counter into LPCM signals. The LPCM signals in the counter are compared in a comparator with signals from an accumulator representing the preceding LPCM signal. The comparator periodically provides lower rate. ADM signals which increment the accumulator. The accumulator is additionally responsive to digital logic which controls the number and sign of the accumulator increments for each ADM signal. Several embodiments of the digital logic are suggested. In one embodiment the digital logic is a read-only memory which performs a known table-look-up function in response to detected patterns of successive ADM signals. In another embodiment the digital logic performs a calculating function in which each successive accummulator counting increment is an arithmetic function, that is, a constant increment added to or mulitple of the previous increment. Although this device avoids analog control of an analog signal with digital logic and an accumulator, it requires high speed LDM signal encoding devices to provide high quality ADM signals.

SUMMARY OF THE INVENTION

It is therefore an object of the invention to provide a communication system utilizing ADM signals and, more particularly, to provide a communication system which includes digital converter means for converting signals in an adaptive delta modulation code (ADM) received over an input path to linear pulse code modulation signals, filter means in such path connected to the output of the digital converter means for smoothing the signals output from the digital converter means, and speed converter means connected to the output of the filter means for decreasing the speed of the signals output by the filter means to a value compatible for use with a pulse code modulation system.

It is a further object to provide a system of such type in which the input path includes analog to adaptive delta modulation converter means for receiving voice signals in an analog format and converting the input voice signals into ADM signals for transmission to the digital converter means and ultimate conversion into CPCM signals. This system is particularly useful as a telephone communication system for transmission of ADM signals over sending or receiving paths between a subscriber switch and a central office which digitally converts the ADM signals into CPCM signals compatible with commercial telephone equipment, and specifically provides ready performance of signal addition as for conference calls and signal multiplication as for echo suppression.

It is a further object of the invention to provide a communication system utilizing ADM signals in which patterns of the ADM signals are detected to provide a pattern controlled digital signal and the pattern controlled digital signal is converted into one pattern controlled analog signal for forming the ADM signals.

It is a still further object of the invention to provide a communication system, for example a telephone system, converting input analog signals through ADM signals into CPCM signals of a given quality without high quality, expensive analog filters for the input and output analog signals.

It is a still further object of the invention to provide particular devices for detecting patterns of ADM signals in a communication system and, more particularly, to provide particular ADM signal pattern detection devices which are directly or plug-for-plug substitutable for each other.

It is a still further object of the invention to provide particular devices for converting a digital signal into an analog signal and, more particularly, for converting a digital signal into a logarithmically related analog signal with only digital control of the analog signal.

To these ends the invention provides a communication system having a sending path over which input signals are converted into ADM signals for transmission to and digital conversion into LPCM signals at a switching central office in the sending path. In a receiving path, the communication system converts LPCM signals into ADM signals which are transmitted over a digital transmission line and then converts the ADM signals into output signals at a subscriber switch terminal. Means in the office portions of the sending and receiving paths preferably convert the LPCM signals to CPCM signals and, if the CPCM signals from the sending path of the system are provided to the receiving path of the system, the communication system then provides output signals from the receiving path which correspond to the input signals to the sending path.

One embodiment of the system has particular utility in a telephone communication system in which analog signals, for example voice signals, are converted into ADM signals in a subscriber switch of the sending path of the system. The ADM signals are then transmitted to the central office of the sending path where the ADM signals are digitally converted into LPCM signals and the LPCM signals converted into CPCM signals which are compatible with commercial telephone equipment. In a central office of the receiving path of this telephone communication system, CPCM signals are converted into LPCM signals which are then digitally converted into ADM signals. The ADM signals are then transmitted to a subscriber switch of the receiving path and converted into analog signals which, if the CPCM signals input to the receiving path were provided from the sending path as, for example, over span lines of a switching system between the central offices of the sending and receiving paths of the telephone system, will correspond to the analog signals originally input to the system. A digital low-pass filter is positioned in the sending path between an ADM to LPCM signal converter and an LPCM to CPCM signal converter and, in the receiving path, between a CPCM to LPCM signal converter and an LPCM to ADM signal converter. These digital low-pass filters eliminate the need for a sophisticated analog low-pass filter at analog signal input and output paths of the respective embodiments. A feature of the specific embodiment is that the conversion from ADM signals to CPCM signals is purely digital; no expensive digital-to-analog and analog-to-digital conversions which necessarily contain high accuracy linear components to preserve the quality of the signal are involved in the conversion process.

DESCRIPTION OF THE DRAWINGS

Preferred embodiments which are intended to illustrate and not to limit the invention will now be described with reference to drawings in which:

FIG. 1 is a block diagram of a sending path of a communication system;

FIG. 2 is a block diagram of a receiving path of a communication system;

FIG. 9 illustrates signals from a signal pattern detector, for example a signal pattern detector shown in FIG. 3, which pattern detector is shown in detail in FIG. 10;

FIG. 10 shows detail of a pattern detector providing signals illustrated in FIG. 9;

FIG. 15 shows detail of one embodiment of a digital to analog signal converter, for example a digital to analog converter signal shown in FIG. 3;

FIG. 16 shows detail of another embodiment of a digital to analog signal converter, for example the digital to analog signal converter shown in FIG. 3; and FIG. 17 shows detail of still another embodiment of a digital to analog signal converter, for example the digital to analog signal converter shown in FIG. 3.

DESCRIPTION OF THE PREFERRED EMBODIMENTS GENERAL DESCRIPTION

Figure 3:
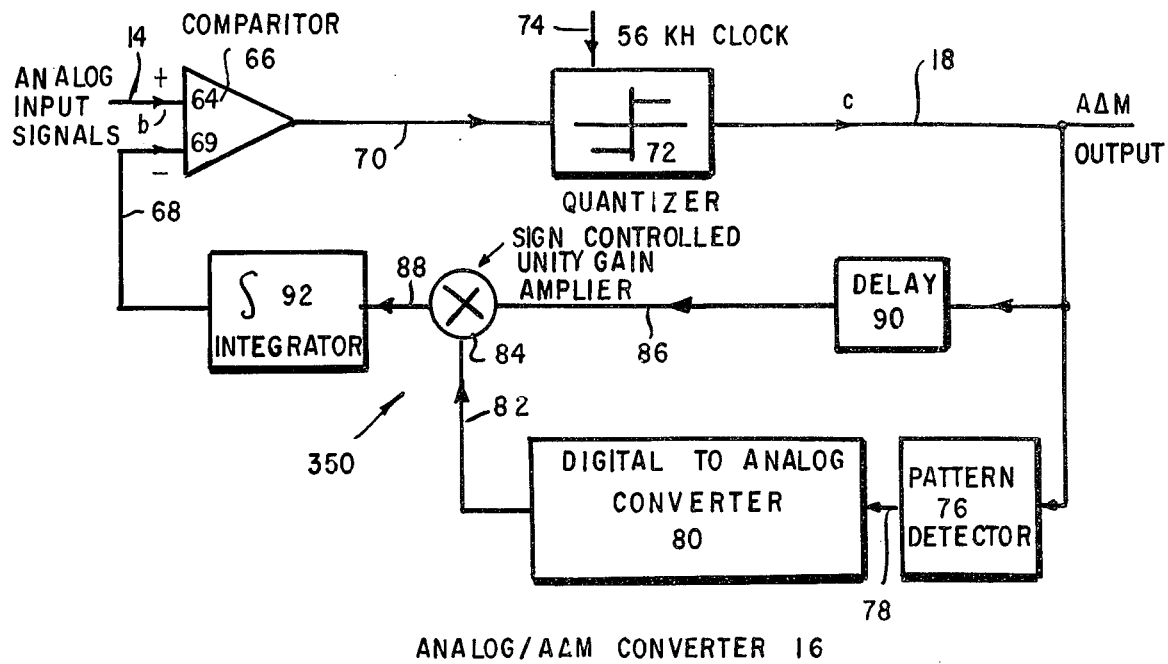
FIG. 3 shows further detail of an analog to ADM signal converter shown in FIG. 1.

FIG. 1 shows the sending path portion of a preferred embodiment of the communication system. This embodiment is intended for use in a telephone communication system. Continuous, time-varying analog input signals a (t), such as voice signals, are provided over a path 10 from, for example, a telephone subscriber. These analog signals are first filtered in an input analog low-pass filter 12 to band limit the frequency spectrum of the input analog signals. As later described, the function of this analog filter may be at least partly assumed by a later described digital filter to minimize the performance requirements of the analog filter 12 without changing the operation of the system. It should also be noted that the system will accept low bit rate digital signals instead of the described analog signals.

The band limited analog signals b from the filter 12 are provided over a path 14 to a converter 16 converting the analog signals into ADM signals c output on path 18. The output ADM signals are preferably at a frequency of 56 KHz for transmission over known T1 lines of a telephone system forming the path 18.

As illustrated, the T1 line comprising path 18 is intended to carry the ADM signals c from a subscriber switch 20 of the telephone system to a central office 22 of the system for further processing. In this embodiment, the filter 12 and converter 16 are then discrete to subscriber input equipment and physically located with the subscriber input equipment in the subscriber switch 20, while the remaining devices of the system are located in the office 22, remote from the subscriber switch.

In another embodiment of this system, known multiplexing equipment (not shown) at the input of the T1 line forming path 18 multiplexes ADM signals from several subscriber switches like illustrated subscriber switch 20 onto path 18. The equipment in the office 22 may then be time shared between the several multiplexed ADM signals input over the T1 line from the plurality of subscriber switches.

Returning to the embodiment illustrated in FIG. 1, the path 18 carries the ADM signals to a converter 24 which digitally converts the ADM signals into LPCM signals d. The LPCM signals from converter 24 are then carried on path 26 to an input digital low-pass filter 28 for smoothing the LPCM signals. A specific, later described operation of this filter 28 permits the elimination of the analog filter 12. Output signals from the filter 28 are then frequency filtered or smoothed LPCM signals e.

From the digital filter 28 the LPCM signals e are carried on a path 30 to a high-to-low speed converter 32. The signals e input over the path 30 are at the frequency of the ADM signals c input to the converter 24, 56 KHz in the above described example. The speed converter 32 then samples the LPCM signals e input over the path 30 to form low speed LPCM signals f output over a path 34. Each LPCM signal output over path 34 is provided to a converter 36 which converts each LPCM signal f into a CPCM signal g. In known telephone systems, CPCM signals are transmitted at an 8 KHz rate. Since the converter 36 converts each input LPCM signal into a CPCM signal, compatibility of the CPCM signals g with known telephone systems having CPCM signals at 8 KHz is achieved by having the speed converter 32 convert the input 56 KHz LPCM signals f into 8 KHz CPCM signals g. Accordingly, the converter 32 functions to sample every seventh LPCM signal e input over the path 30 for each LPCM f output over the path 34. The output from the converter 36 is then 8 KHz CPCM signals which are provided to an output path 38.

FIG. 2 illustrates a receiving path portion of the preferred embodiment which receives input CPCM signals h over a path 38'. These signals h are preferably at 8 KHz as, for example, from a known telephone system (not shown). Specifically, the CPCM signals h input over the path 38' may be carried through the known telephone system from the path 38 (FIG. 1).

The CPCM signals input over the path 38' are each converted into LPCM signals i in a converter 40. The signals i from the converter 40 are then 8 KHz LPCM signals which are provided to a path 42.

The LPCM signals i on the path 42 are carried to a converter 44 which converts the signals from a low input speed to a high output speed for output over a path 46. The converter 44 operates by repeating each input, low-speed LPCM signal i received over the path 42 into a series of identical, high-speed LPCM signals j output over the path 46. Looking ahead in FIG. 2, it is seen that it is desired in this embodiment to transmit signals from an office 22' to a subscriber switch 20' over a T1 line later described as forming a signal-carrying path 54. As before described, known T1 lines of telephone systems accept signals at 56 KHz. It is therefore desirable that the converter 44 convert the input 8 KHz LPCM signals i into 56 KHz LPCM signals j output over the path 46. Accordingly, the converter 44 operates by repeating each input LPCM signal i seven times onto the output path 46 as 56 KHz LPCM signals j.

The 56 KHz LPCM signals j on path 46 are provided to an output digital low-path filter 48. The output digital filter provides frequency filtered 56 KHz LPCM signals k output over a path 50 to an LPCM to ADM signal converter 52. Converter 52 converts each input LPCM signal into an ADM signal thereby forming 56 KHz ADM signals 1 for output over a path 54. The path 54 is illustrated as a known T1 line for carrying the ADM signals from the converter 52 which, as illustrated, is physically in the office 22' of the receiving path, to a subscriber switch 20' of the receiving path. In similarity with the description of FIG. 1, the subscriber switch 20' is physically located with subscriber terminal equipment remote from the office 22'.

The ADM signals 1 carried over path 54 to the subscriber switch 20' of the receiving path are first provided to a converter 56 which converts the ADM signals input over the path 54 into analog signals m. The analog signals m from the converter 56 are then carried over a path 58 to an output analog low-pass filter 60 which band limits the signals from the converter 56 to eliminate quantizing noise portions of the input analog signal m thereby avoiding waveform distortion of the output analog signal n. The filter 60 then provides frequency filtered output analog signals n over a path 62 to, for example, a subscriber. If, as suggested, the CPCM signals g on path 38 from the sending path (FIG. 1) of the system are carried through a known telephone system (not shown) to the input path 38' (FIG. 2) as the CPCM signals h on path 38', the output analog signals n on path 62 (FIG. 2) will then correspond to the input analog signal a(t) on the path 10 (FIG. 1).

MORE DETAILED DESCRIPTION OF THE SENDING PATH

Figure 5:
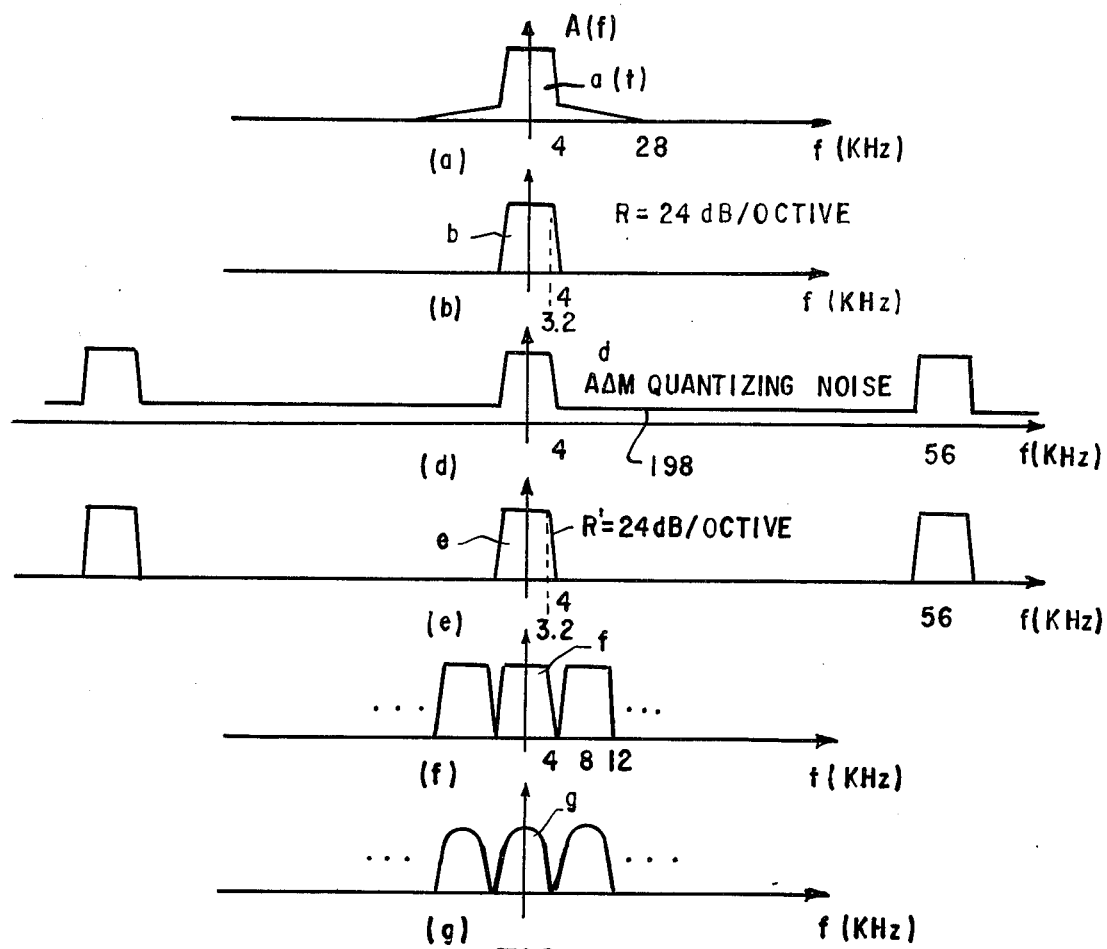
FIGS. 5(a)-(g) show frequency spectrums for signals in the sending path shown in FIG. 1.

As described with reference to FIG. 1, analog signals a(t) input over the path 10 are first band-pass filtered in analog filter 12 for output over the path 14 as the signals b. Specific designs for filters, like filter 12, which pass a band or limit a spectrum of signal frequencies are well understood by those skilled in the art. Therefore, no specific design for filter 12 need be given, it being sufficient instead to specify the performance requirements of the filter 12. FIG. 5(a) gives an example to illustrate the frequency spectrum of the analog signals a(t) input over the path 10 (FIG. 1). Normalized amplitudes A(f) of signals are shown in FIG. 5 as a function of the frequency f(KHz) of the signals to indicate the spectra of the frequencies of the corresponding signals. As known for voice signals in telephone systems, such as the signals a(t), the signals have a principal 8 KHz signal frequency range illustrated in FIG. 5(a) as positive and negative 4 KHz bands. Each of the 4 KHz signal bands is flanked by a side lobe extending to about 28 KHz. FIG. 5(b) illustrates a frequency spectrum for the output signals b on the path 14 from the analog filter 12 (FIG. 1). It is then seen that the analog filter has a 3 dB cut-off frequency at 3.2 KHz and a pass band to stop band roll-off R of 24 dB per octave to provide the signal spectrum illustrated in FIG. 5(b) for the signals b from the signals a(t) shown in FIG. 5(a).

As shown in FIG. 1, the signals b on the path 14 are provided to the analog to ADM signal converter 16. The converter 16 is more specifically illustrated in FIG. 3. In FIG. 3, the filtered analog input signals b on the path 14 are shown as provided to port 64 of a comparator 66 which also receives analog signals from a path 68 at another port 69. The comparator 66 compares the amplitudes of the analog signals at the ports 64, 69 to provide a high level signal to an output path 70 if the signal input to the port 64 exceeds that at the port 69 and a low level signal to the path 70 if the signal at the port 69 exceeds that at the port 64. The comparator 66 may then be an operational amplifier connected as a potential comparator as well understood in the art or an off-the-shelf device of the type designated CMP-01 and commercially available from Precision Monolithics.

The signals on the path 70 are shown as provided to a two-level quantizer 72 also receiving a 56 KHz signal on a path 74 from a clock (not shown). Clock devices for producing pulse signals of preselected frequencies are well known in the art and need not be described here. The quantizer 72 functions to provide signals at one of two desired logic levels selected by the high or low state of the signals input over the path 70 only at each clock signal input over the path 74. The resulting signals c, output on the path 18, are then 56 KHz binary-encoded pulses. For this purpose, the quantizer 72 may be a commercially available trigger device.

The signals c on the path 18 are thus 56 KHz binary logic pulse signals, the logic levels of which are determined by the relative polarity of the analog signals input to the ports 64, 69 of comparator 66. The signal to the port 69 is locally generated from the signals c on the path 18 in devices now to be described. However, it will be immediately appreciated that, since each output signal c is locally generated into a signal at port 69 which, by comparison with the input signal at port 64, determines the logic state of the next signal c, the signals c are delta modulation signals.

To locally generate the signals at port 69, the signals c from path 18 are first provided to a pattern detector 76. The pattern detector 76 detects pre-selected patterns of the logic levels of successive signals c on the path 18. For example, in one later described embodiment, the pattern detector 76 detects two consecutive signals c of the same logic state, for example, two consecutive logic one signals. The specific pattern of the signals c which the pattern detector 76 is preset to detect is determined with respect to the type of input signal and the desired performance of the system, for example, the desired signal to noise ratio. Several particularly desirable patterns are later described. Upon detecting the preset pattern, the detector 76 provides preset digital signals to output path 78. Since the detector 76 provides the output digital signals to path 78 in response to detected patterns of the input signals c, the output signals are pattern controlled digital signals.

The pattern controlled digital signals on the path 78 are provided to digital-to-analog converter 80. Digital-to-analog converter 80 is responsive to logic levels of the pattern controlled digital signals received over the path 78 to provide an analog signal of one preset polarity but having an amplitude related to the instantaneous total of the pattern controlled digital signals. Preferably the analog signal from converter 80 is exponentially related to the instantaneous total of the pattern controlled digital signals to form a pattern controlled analog signal given by $X^n$ where $X$ is the logarithmic base constant and n is an integer between zero and $m$, $m$ being an integer defining the limits of performance of the converter 80. Several specific converters 80 are later described. The output from the converter 80 is provided to a path 82, which thus carries an analog signal having an absolute amplitude determined by the patterns of the logic levels of the successive signals c on the path 18.

This pattern controlled analog signal on the path 82 is provided to an amplifier 84 having a unity gain of a polarity controlled by a signal input over path 86. The amplifier 84 then provides an output signal to a path 88 having the absolute amplitude of the pattern controlled analog signal input on path 82 but a polarity or sign determined by the signal input on path 86.

The sign controlling signal on the path 86 is provided from a delay device 90 receiving as an input the signals c from the path 18. It will be recalled that the signals c are encoded in binary logic state which represent the polarity of the increment represented by the signals. Delay device 90 then provided signals to path 86 which have logic states corresponding to the logic states of the signals c for controlling the polarity of the unity gain in the amplifier 84 in response to the logic state of the signal then on the path 86. Delay device 90 then delays each input signals c for the time required for the pattern detector 76 and digital-to-analog converter 80 to generate the analog signal on the path 82 corresponding to the input signal c. Accordingly, the delay device may be a known gate device responsive to each successive signal on the path 82 for triggering the signal corresponding in logic state to the input signal c onto the path 86 to the amplifier 84. Alternatively, it is noted that each signal c from the path 18 is similarly processed in detector 76 and digital-to-analog converter 80 and should, therefore, have similar delay times before converter 80 provides the signal to output path 82 thereby permitting delay device 90 to be a timer of fixed delay time. Such delay devices are commercially available.

Then, as described, the signals on path 88 are output for each output signal c and have a sign controlled by the logic state of the corresponding one of the signals c, but have an analog amplitude controlled by patterns of the successive signals c. These pattern controlled analog signals are provided to an integrator 92 which linearly integrates each pattern controlled analog signal from the path 88 as an increment to the preceding signals from the path 88 to form the analog signal output over path 68 to port 69 of comparator 66. It will be recalled that the signal to port 69 determines, by comparison with the input signals b, the signals c. Then, since patterns of the signals c control the signal on path 88 which is integrated at 92 into an increment of the signal to port 69, the signals c are now seen to be ADM signals in which each signal c represents a variable increment of the input analog signal determined by the patterns of the preceding signals c. Moreover, the specific size of the increment represented by each signal c was controlled by the amplitude of the pattern controlled analog signal from converter 80 which was described as preferably being a logarithmic function of the total patterns detected by pattern detector 76. Therefore, the preferred embodiment provides logarithmic companding to the ADM signals c which is known to advantageously provide a constant signal to noise ratio to the ADM signals. Finally, the ADM signals c were derived from a pattern controlled digital signal which was converted in digital-to-analog converter 80 into one pattern controlled analog signal thereby avoiding the difficult analog control of the analog signals known from the art.

Figure 4:
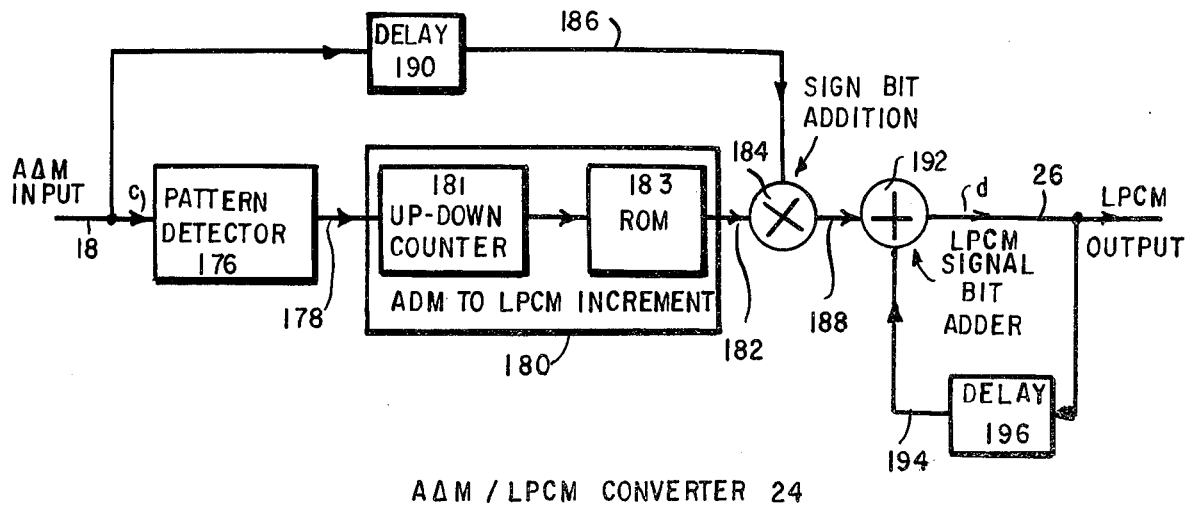
FIG. 4 shows further detail of an ADM to LPCM signal converter shown in FIG. 1.

FIG. 4 shows detail of the converter 24 which, as also illustrated in FIG. 1, receives ADM signals c from the path 18 and provides LPCM signals d to an output path 26. As just described, the input ADM signals c are each a single pulse or bit encoded in logic level to represent variable increments of change in the analog signal $a(t)$ input to the analog to ADM converter 16 (FIG. 1), the specific increment represented by each ADM signal bit being dependent upon the patterns of the successive ADM signals as detected by pattern detector 76 (FIG. 3) and converted to the analog pattern controlled signal in digital-to-analog converter 80 (FIG. 3). Then, to convert these ADM signals into LPCM signals which, it will be recalled, represent the total amplitude of the input analog signal $a(t)$, it is clearly necessary to first determine the increment of the analog signal represented by each ADM signal and then add this increment, in LPCM format, to the total of the preceding increments to form an LPCM signal representing the full analog signal.

To form the LPCM signal increment, FIG. 4 shows the ADM signals c on path 18 as being provided to a pattern detector 176 which detects patterns of the ADM signals c to provide a pattern controlled digital signal over path 178 to a converter 180. Converter 180 responds to these signals with a LPCM signal representing only the magnitude of the LPCM increment. Since the logic state of each ADM signal represents the sign or polarity of the increment, each ADM signal c is also delayed in device 190 for output coincident with the LPCM increment magnitude signal from converter 180 to a device 184 which adds a sign bit to the LPCM increment magnitude signal to form a LPCM increment signal output on path 188.

From this generally described operation it is clear that the LPCM increment signal will most closely represent the increment of the analog signal $a(t)$ (FIG. 1) represented by each ADM signal c (FIG. 4) if the patterns of the ADM signals detected by pattern detector 176 for conversion in converter 180 into the LPCM increment magnitude signal are the same as the patterns of the ADM signals detected by pattern detector 76 (FIG. 3) for forming the ADM signals, although, of course, other patterns may also be detected. Therefore, pattern detector 176 (FIG. 4) is preferably identical to the earlier described pattern detector 76 (FIG. 3) and requires no further description. Pattern detector 176 then provides a digital output signal to path 178 controlled by the patterns of the ADM signals c input on path 18. Specifically, the pattern controlled digital signals on the path 178 are single bit, binary-encoded logic signals.

The pattern controlled digital signals on path 178 are provided to a converter 180 which converts the signal increment represented by the logic state of the signal on the path 178 into a signal word or series of pulses encoded in logic state to represent the same interval as the signal input over the path 178. The signal word is an LPCM signal. The converter 180 is shown to comprise a reversible or up-down counter 181 which increments or counts up in response to one logic state of the digital signal input on the path 178 and decrements or counts down in response to the other logic state of the signal on the path 178. For example, if the pattern detector detects two consecutive high logic level ADM signals $c$ on the path 18 to provide a high logic level signal to the path 178 which represents a change in the increment of the analog signal represented by the succeeding ADM signal, the counter 181 will respond to the high logic level signal on the path 178 with one up-count to thereby represent the increased increment or step of the analog signal $a(t)$ (FIG. 1) represented by the succeeding ADM signal. The signals from the counter 181 are then provided to a device 183 which converts the counted signal increments into a corresponding LPCM signal word. For this purpose, the device 183 is a read only memory device preset with a table of LPCM signal words corresponding to each possible count signal from counter 181. The memory device 183 then responds to each count of the counter 181 with an LPCM signal word on path 182 representing, in LPCM format, increment represented by the corresponding ADM signal. Such operation of the read only memory device 183 is a wellknown table-look-up function needing no further explanation to those skilled in the art.

The described counter 181 and ROM 183 of ADM to LPCM signal converter 180 should be understood as merely a preferred embodiment. In alternative embodiments the converter 180 may have a shift register (not shown), like later described shift register 622 (FIG. 16) in place of the counter 181 and a counter (not shown) counting increments as controlled by the shift register. This and other alternative embodiments of converter 180 will be understood by those in the art as performing the described function of ADM to LPCM signal conversion.

The signals on the path 182 then represent, in LPCM format, the increment or step represented by the corresponding input ADM signals. To minimize the size of the memory device 183 and to provide symmetrical operation for positive and negative increments represented by the LPCM signal, the ADM signals from path 18 are stored in delay device 190 which is similar in function and construction to the delay device 90 earlier described with reference to FIG. 3. The ADM signal, which, it will be recalled, represents in its logic state the sign of the corresponding increment, is carried from device 190 on path 186 to a sign bit adder 184 also receiving the LPCM signal on the path 182. The sign bit adder 184 then introduces the sign to the LPCM increment signal as one distinct bit of the LPCM increment signal, which bit corresponds in logic state to the ADM signal. The LPCM increment signal on path 182 from memory device 183 then represents only the magnitude of signal increment, the sign of the increment being introduced by signal bit adder 184. This function of adder 184 will be recognized as equivalent to the function earlier described for amplifier 84 (FIG. 3). However, it will be noted that sign bit adder 184 operates upon the digitally encoded LPCM increment signal word while amplifier 84 (FIG. 3) operates on an analog signal. In the LPCM signal scheme, the last or most significant bit of the LPCM signal word usually represents the positive or negative sign of the LPCM signal word. Therefore, sign bit adder 184 may comprise a commercially available signal controlled gate which introduces the additional sign bit from path 186 at the end of each LPCM signal word output over path 188.

Since the signal on the path 188 represents merely the signed increment or step of the LPCM signal corresponding to the increment of change in the analog signal $a(t)$ originally input on the path 14 (FIG. 1), but not the total signed amplitude of the input analog signal, further operation is required to provide the LPCM signal $d$ on path 26 which represents the full instantaneous signed amplitude of the input analog signal. To this end the invention provides a sequential logic scheme in which an adder 192 receives the LPCM signal increment on the path 188 and an LPCM signal on the path 194 from a one-word delay device 196 receiving the LPCM signal $d$ output from the adder 192. Then, each successive LPCM signal $d$ output on the path 26 is stored in the delay device 196 until the next LPCM signal increment appears on the path 188 and is then added in adder 192 to the preceding LPCM signal from delay device 196. The preceding LPCM signal from delay device 196 added to the next LPCM signal increment from path 188, with the appropriate sign from the larger signal, then forms the LPCM signal $d$ including the sign which is output over the path 26 to filter 28 (FIG. 1) and to the delay device 196 for addition to a next LPCM increment signal input over path 188.

This implementation of the LPCM signal through adder 192 is thus seen to be distinct from other implementations of LPCM signals suggested in the art. Specifically, in the above cited co-pending U.S. Pat. application of Song, input LDM signals which, because of their linear modulation, directly correspond to the linear increments of an LPCM signal, are directly accumulated in an up-down counter to form an LPCM signal representing the input signal. The implementation of the LPCM signals here described is also seen to be distinct from the accumulator scheme shown in the above cited patent of Goodman in which a digital logic device responds to patterns of ADM signals with a signal which controls the counting progression of an accumulator which then forms the LPCM signals. The above described LPCM signal formation will also be recognized as distinct from the teachings of the above cited co-pending U.S. Pat. application of Wintz, Sergo and Song in which a digitally encoded signal word, actually a CPCM signal, is decoded into an analog signal which analog signal is then used for the generation of the succeeding CPCM signal. Another distinct technique controls the step size of an integrator with an analog signal responsive to patterns of input ADM signals which integrated signal is then reconverted to digital signals in LPCM code. In contrast, the implementation here describes a digital LPCM increment signal, digitally controlled by the patterns of the ADM signals, for direct, digital addition with the preceding LPCM signal. It will later be seen that this digital conversion of ADM to LPCM signals is also applied in the receiving path for the conversion of LPCM to ADM signals again in difference from the art in which distinct implementations are often used in the sending and receiving paths.

Returning to the embodiment illustrated in FIG. 1, the LPCM signals d output on the path 26 by the converter 24 just described are shown as provided to the digital low pass filter 28. The design of digital filters is well understood by those skilled in the art and no detailed design description of the filter 28 need, therefore, be given, it being sufficient instead to describe the operating requirements of the filter. The function of the input digital low pass filter 28 is to band limit the wide-band quantizing noise generated during the ADM encoding of the input signal. Aliassing noise will then not occur when the high-speed LPCM signal is converted to a low-speed LPCM signal in the speed converter 32. This operation of the filter is illustrated in FIGS. 5(d) and 5(e) showing a normalized signal frequency spectrum for the LPCM signals d input to the digital filter 28 and the LPCM signals e output from the digital filter over path 30, both for the exemplary 56 KHz signals having the input 8 KHz band width earlier described with reference to FIG. 4(b). However, the LPCM signals d are now shown to be accompanied by a wide band of ADM quantizing noise 198 resulting from the approximation of the input analog signal with the discrete ADM signal quantizing levels. On the other hand, the LPCM signals e on the path 30 (FIG. 1) from the filter 28 (FIG. 1) are shown in FIG. 4(e) to be band-limited by the elimination of the quantizing noise. The digital filter 28 (FIG. 1) thus functions to provide an 8 KHz band width to the 56 KHz sampled LPCM signals e shown in FIG. 5(e).

It may additionally be demonstrated that if the digital filter is given the frequency characteristics earlier described for the input analog low-pass filter 12 (FIG. 1) and illustrated in FIG. 4(b), the input analog low-pass filter 12 may be eliminated or its performance requirements relaxed without signal degradation. For equivalent performance with the earlier described analog filter 12 (FIG. 1), the digital filter 28 (FIG. 1) should then have or provide in combination with relaxed performance of the input analog filter 12 the illustrated 3dB cut-off frequency at 3.2 KHz and a pass-band to stop-band transition roll-off R' of 24 dB per octave illustrated for the LPCM signal frequency spectrum in FIG. 4(e). It is to be noted that the input analog filter 12 can be eliminated provided that the input voice signal spectrum is itself band limited to 28 KHz, since the effective sampling frequency of the ADM is 56 KHz before the speed is dropped to 8 KHz at the speed converter 32. It is additionally noted that the converse of the suggested elimination of the input analog low-pass filter 12 (FIG. 1) by proper design of the input digital low-pass filter 28 (FIG. 1), that is the elimination of the input digital low-pass filter by proper design of the input analog low-pass filter, is not possible because the analog filter 12 cannot remove the ADM signal quantizing noise 198 (FIG. 4(d)) which is introduced to the signals by the analog to ADM converter 16 after the signals leave the analog filter 12. This operation of the system is clearly illustrated in FIG. 1 showing the input analog low-pass filter 12 in a location upstream of the analog to ADM converter 16.

The LPCM signals e from the digital filter 28 on path 30 are provided to the high-to-low speed converter 32 as shown in FIG. 1. As earlier described the speed converter 32 is a sampling device receiving a series of the input high-speed LPCM signals and providing low-speed LPCM signals f to the path 34 each of which is a selected one of several consecutive input high-speed LPCM signals. For this purpose the speed converter 32 may be a commercially available shift registers enabled to receive and output one of the input high-speed LPCM signals e by a signal from a clock (not shown). For the earlier described speed conversion for 56 KHz LPCM signals e to 8 KHz LPCM signals f, the clock enables the register for every seventh LPCM signal e to provide 8 KHz LPCM signals f. Since selected signals e are then transmitted as the signals f, the frequency spectrum for the low-speed LPCM signal f shown in FIG. 5(f) is exactly the frequency spectrum of the corresponding input LPCM signal e shown in FIG. 5(e).

The LPCM signals f (FIG. 1) are then provided to the LPCM to CPCM converter 36. LPCM to CPCM signal converters are known. Therefore, no detailed illustration of the converter 36 need be given. One known type of LPCM-CPCM signal converter receives each bit of the LPCM signal in a serial to parallel shift register (not shown) which then provides the LPCM signal in parallel format. The parallel LPCM signal is then provided to a read only memory device (now shown) which has preset appropriate code conversions for converting each input LPCM signal into a CPCM signal, for example the CPCM signal g shown as output over the path 38 in FIG. 1. Another LPCM-CPCM converter is specifically described in the above cited co-pending U.S. Pat. application of Song. Therefore, no further description of the converter 36 will be given.

MORE DETAILED DESCRIPTION OF THE RECEIVING PATH

FIG. 2 shows input CPCM signals h on a path 38' which, for example, may be connected through span lines of a known telephone system to the output path 38 (FIG. 1) to provide the CPCM signals g (FIG. 1) to path 38' as the CPCM signals h. The CPCM signals h on the path 38 are provided to the CPCM to LPCM signal converter 40. CPCM to LPCM signal converters are generally known and therefore require only brief description. One such converter may be comprised of a serial to parallel shift register (not shown) and a read-only memory device (not shown) preset with the desired table of code conversion for forming the parallel CPCM signals input from the shift register into corresponding LPCM signals. This CPCM to LPCM signal converter then performs a known table look-up function in which each input CPCM signal is converted to an output LPCM signal for example signals i on the path 42. Another CPCM to LPCM converter is described in the above referenced U.S. Pat. application of Song. Therefore no further description of converter 40 need be given.

The LPCM signals i on the path 42 are then provided to the low-to-high speed converter 44 which increases the speed or frequency of the input LPCM signals to provide higher speed LPCM signals j to the path 46. For this purpose the speed converter 44 may be a commercially available serial to parallel shift register (not shown) providing the input LPCM signals i in parallel format to a commercially available parallel to serial shift register (not shown) also receiving signals from a clock (not shown) for triggering output of the LPCM signals j in serial format at a desired output frequency established by the clock signals. In known telephone systems, CPCM signals are provided at 8 KHz. As earlier described, each input CPCM signal h is converted to one LPCM signal i which, therefore, are also at 8 KHz. It will also be recalled that it is desired to transmit the LPCM signal i which, therefore, are also at 8 KHz. It will also be recalled that it is desired to transmit the LPCM signals over a T1 line forming path 54 at 56 KHz. Therefore, in the embodiment shown in FIG. 2, it is desired to convert the LPCM signals i input to the speed converter 44 at 8 KHz to 56 KHz LPCM signals j output on the path 46. The frequency of the clock signals to the shift registers (not shown) forming the speed converter 44 should therefore be 56 KHz to effectively repeat each of the input 8 KHz LPCM signals seven times thereby providing seven, identical, 56 KHz output LPCM signals j for each input LPCM signal i. This operation is illustrated in FIG. 8(i) showing a frequency spectrum of the sampled 8 KHz LPCM signals i200 and FIG. 8(j) showing a frequency spectrum of 56 KHz LPCM signals j200 after the speed conversion.

The LPCM signals j are provided on the path 46 to the output digital low-pass filter 48 (FIG. 2), the design of which, as with the input digital low-pass filter 28 (FIG. 1), is well understood by those skilled in the art. No specific illustration of the output digital low-pass filter 48 is therefore given. The purpose of the output digital filter 48 is to band-limit the signal spectrum of the input high-speed LPCM signals j to 4 KHz to remove noise signals having frequency spectrum 203 (FIG. 8(j)) introduced by the speed converter 44 (FIG. 2). This function is shown in FIGS. 8(j) and 8(k). FIG. 8(j) illustrates the frequency spectrum j200 of the 56 KHz LPCM signals j (FIG. 2) together with that of the noise spectrum 203, while FIG. 8(k) illustrates the frequency spectrum of the filtered high-speed LPCM signals k (FIG. 2) showing that the signals k have the spectrum k200 corresponding only to the spectrum j200 (FIG. 8(j)) of the input LPCM signals j.

As described with reference to the input digital low-pass filter 28 (FIG. 1) and the input analog low-pass filter 12 (FIG. 1), the output digital low-pass filter 48 (FIG. 2) may relax the function of the output analog low-pass filter 60 (FIG. 2). Since the effective sampling frequency on path 58 is 56 KHz the sharp frequency cut-off analog filter generally required in a LPCM coding can be replaced with a simpler analog filter.

Figure 6:
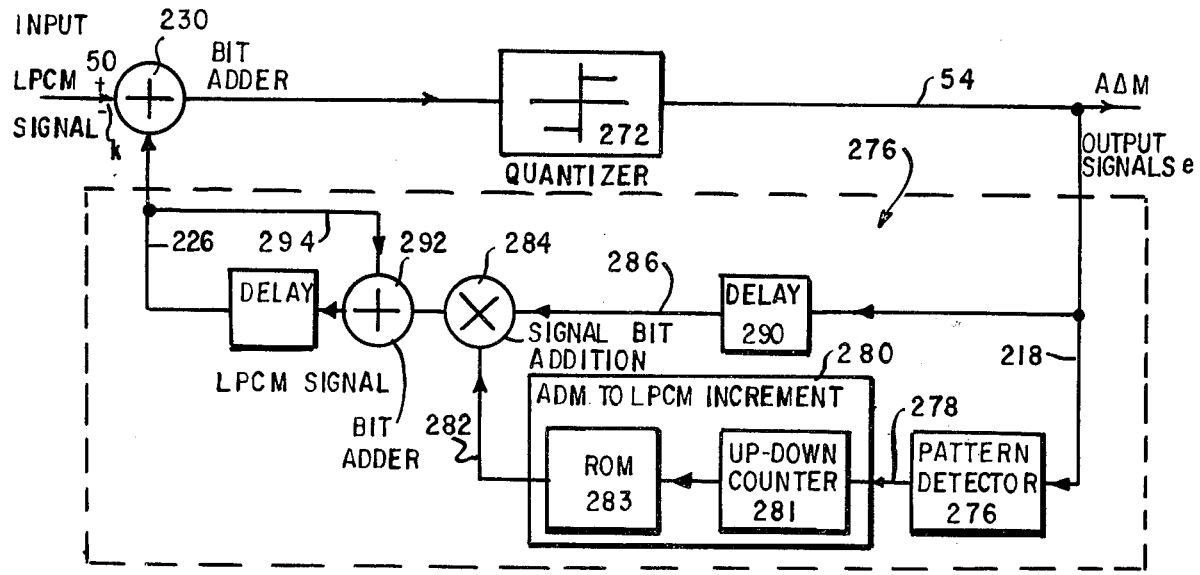
FIG. 6 shows further detail of an LPCM to ADM signal converter shown in FIG. 2.

As shown in FIG. 2, the 56 KHz high-speed LPCM signals k on the path 50 from the output digital low-pass filter 48 are provided to the LPCM to ADM converter 52. Further details of the converter 52 are shown in FIG. 6. The LPCM signals on the path 50 are, it will be recalled, signal words composed of a series of bits each bit being encoded in logic state to form the LPCM signal, the bit in the most significant bit place representing the sign of the LPCM signal. This LPCM signal k from the path 50 is then provided to an adder 230 together with a signed LPCM signal on a path 226. The adder 230 adds these two signed LPCM signals and the quantizer 272 detects the sign of the total then representing the sign of the larger of the two LPCM signals input to the adder at a 56 KHz rate. This sign signal is provided on a path 54.

The signals on the path 54 are then recognized as delta modulation signals composed of a single binary-encoded bit corresponding in its logic state to an increment by which one of the LPCM signals input to the adder 230 exceeded the other. In the formation of ADM signals it will be recalled that the increment represented by each ADM signal is to be smaller for smaller input signals than for larger input signals. To this end, the LPCM signals on the path 226 are seen to be locally generated in a device at 276 for converting the delta modulation signals on the path 54 into corresponding LPCM signals for output on the path 225 and comparison with the input LPCM signals on path 50 in the adder 230 as just described. The device 276 variably responds to the delta modulation signals on path 54 with the LPCM signals on the path 226 to form the delta modulation signals on the path 54 as ADM signals.

The device 276 will be recognized as identical with the ADM to LPCM converter 24 previously described with reference to FIG. 4. Accordingly, only a brief description of device 276 need be given. The ADM signals from the path 54 are introduced via path 218 to a pattern detector 276 which detects preselected patterns of the input ADM signals. Digital signals controlled by the patterns of ADM signals are then provided on path 278 to a device 280 which generates LPCM signals corresponding in magnitude to that identified by the digital signals controlled by the patterns of the ADM signals. At the same time, the ADM signals on the path 218 are provided to a delay device 290 for introduction over a path 286 to a device 284 which adds the sign of the input ADM signal as an additional sign bit to the LPCM magnitude signal from the path 282 in the most significant bit place of the LPCM signal. The signed LPCM increment signal from the device 284 is then provided to an adder 292 also receiving via paths 226, 294 the preceding LPCM signal. The resulting sum of the LPCM signal introduced over path 294 and the LPCM increment signal introduced from sign-bit adder 284 is then provided as an output over path 226 which, after delay in a device 296, coincides with a next LPCM increment signal to adder 292.

As described with reference to converter 24 shown in FIG. 4, it is noted that digital logic is used throughout device 276 in providing the LPCM signal to path 226 from the ADM signals on path 54. It is additionally noted as an advantage of this digital design of converter 52 that the components of device 276 are the same as those of converter 24 (FIG. 4) so as to minimize the number of different components required by the system by duplicating components of the encoder portion in the decoder portion of the system. This duplication of components introduces an economy of scale to the cost of the system by permitting manufacture of a minimum of different parts and ease of maintenance in the system again by minimizing the number of different parts necessary for the system.

Figure 7:
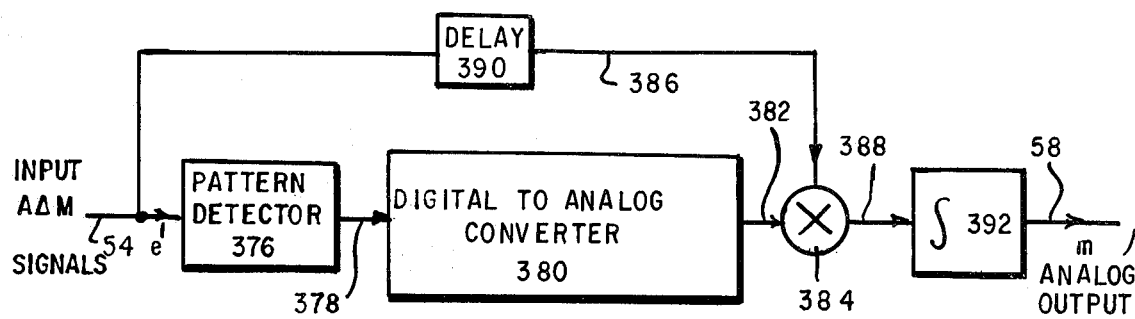
FIG. 7 shows further detail of an ADM to analog signal converter shown in FIG. 2.

These same advantages from the duplication of portions of the encoder in the decoder are also provided to the ADM to analog converter 56 to which the ADM signals 1 on the path 54 are next provided, as shown in FIG. 2. As earlier described, the path 54 may, for example, be a T1 line connecting the office 22' of the system to a subscriber switch 20'. Detail of the ADM to analog converter 56 is shown in FIG. 7. Converter 56 will immediately be recognized as a portion 350 of the analog to ADM converter 16 shown in FIG. 3. The portion 350 of converter 16, it will be recalled from the earlier description, converted the ADM signals on the path 18 into analog signals output from integrator 92 onto path 68. This is precisely the function of the ADM to analog converter 56 shown in FIG. 7 thereby indicating through the similarity of functions, the illustrated similarity of design. Accordingly, only a brief description of converter 56 need be given.

The ADM signals 1 are provided on the input path 54 to a pattern detector 376 which detects patterns of the ADM signals to provide a digital pattern controlled signal on a path 378 to a digital-to-analog converter 380. Converter 380 then provides analog signals having an amplitude controlled by the patterns of the ADM signals detected in pattern detector 376. The analog signals are provided from the converter 380 on path 382 to a sign controlling unity gain amplifier 384 receiving a signal on a path 386 from a delay device 390 indicating the logic state of each ADM signal on the path 54. The amplifier 384 applies the logic signal from path 386 to the analog signal magnitude from the path 382 to provide a signed analog signal to path 388 which then has a magnitude controlled by the patterns of the ADM signals and a polarity determined by the logic state of the corresponding ADM signal. This pattern controlled, signed analog signal is then integrated in a linear integrator 392 as an increment of an analog signal output on the path 58.

Figure 8:
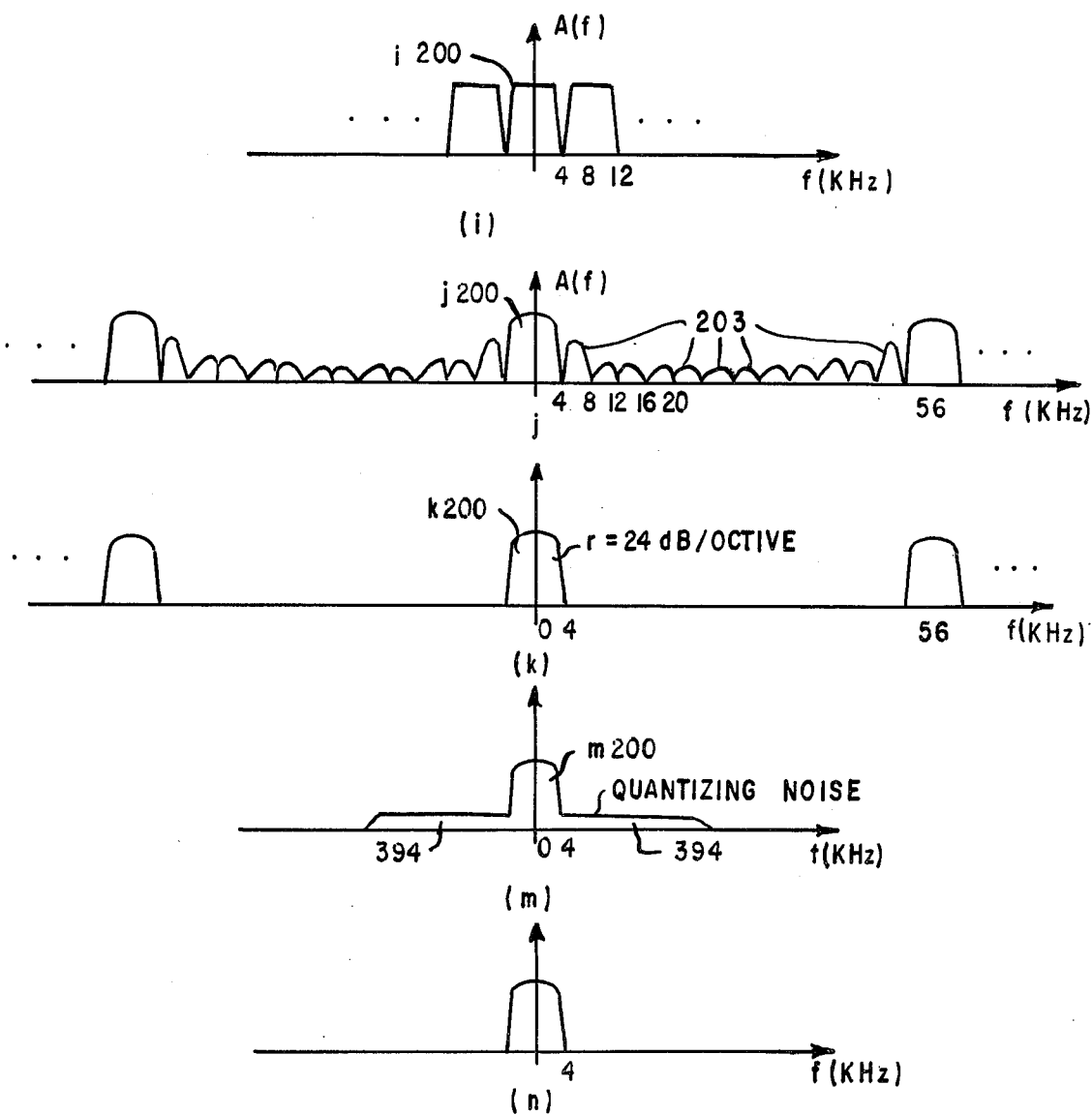
FIGS. 8(h)-(n) shows frequency spectrums for signals in the receiving path shown in FIG. 2.

The analog signal m on the path 58 has a frequency spectrum illustrated in FIG. 8($m$) which shows the normalized frequency spectrum for the analog signal $m200$ corresponding to the input LPCM signal but now accompanied by side bands of quantizing noise 394 (FIG. 8($m$)) introduced by the approximation of the analog signal from the discrete levels of the ADM signals in the converter 56. Then, as earlier described, it is the function of the output analog low-pass filter 60 (FIG. 2) to eliminate the quantizing noise bands 394 (FIG. 8($m$)) from the frequency spectrum of the analog signals n output from the output analog low-pass filter 60 (FIG. 2) on path 62 (FIG. 2). The resulting frequency spectrum for the output analog signals $n$ is shown in FIG. 8($n$) to be band limited to 4 KHz, which as described, corresponds to the frequency spectrum of the analog signals m shown in FIG. 8($m$) with the quantizing noise bands 394 filtered out. Specific designs for such band limiting filters are known. It is noted, however, that the requirement of the output analog low-pass filter 60 may be relaxed due to the high sampling frequency of the ADM signal.

DETAILED DESCRIPTION OF THE PATTERN DETECTORS

In the above complete description of the preferred embodiment of the system, pattern detectors 76, 176, 276 and 376 were described with specific reference to FIGS. 3, 4, 6 and 7, respectively. In the description of these figures, it was noted that each of the pattern detectors 76, 176, 276, 376 was preferably of the same design to provide compatibility of operation of each portion of the system including one of the pattern detectors with each other portion of the system. The similarity of design of the pattern detectors may also provide economies of scale to the cost of the system and ease of maintenance to the system. Several embodiments of the pattern detector 76, 176, 276, 376 will now be specifically described, it being understood that each of the pattern detectors may be of any of the specifically described embodiments although all the pattern detectors are preferably the same within one system. However, the pattern detectors in any one embodiment of the forward path must be the same; similarly, the pattern detectors of any one embodiment of the receiving path must be the same.

DETAILED DESCRIPTION OF A 7-7-4-3 RULE PATTERN DETECTOR

One specific embodiment of the pattern detectors follows a rule designated 7-7-4-3 which was empirically developed to provide maximum signal to noise ratio on sinusoidal input signals as described by Daugherty in "Digitally Companded Delta Modulation for Voice Transmission,"

The algorithm of the 7-7-4-3 rule for companding ADM signals is described as follows:

If the last change in companding the ADM signals was to increase the step or signal increment represented by the pattern controlled signals, seven consecutive ADM signals of identical logic state are required for a further increase, but only four consecutive ADM signals of alternating logic state are required for a decrease in the step;

If, on the other hand, the last change in companding the ADM signals was to decrease the step or signal increment represented by the pattern controlled signals, seven consecutive ADM signals of alternating logic state are required for a further decrease, but only three consecutive ADM signals of identical logic state are required for an increase in the step.

FIG. 9 illustrates the application of the described 7-7-4-3 rule to the pattern detector 76 of the analog to ADM converter 16 shown in FIG. 3. Since pattern detector 76 is preferably identical to pattern detectors 176, 276, 376, only pattern detector 76 need be described.

Then, FIG. 9 shown at 400 an arbitrary portion of the input analog signal $a(t)$ input over path 14 (FIG. 3) as a function of time t. As described with reference to FIG. 3, the input analog signal is converted to ADM signals $c$ at a 56 KHz sampling rate to form the binary-encoded single bit ADM signals $c$ shown at 402 in FIG. 9. Also shown in FIG. 9 are the pattern controlled digital signals 404 output on the path 78 from pattern detector 76 as described with reference to FIG. 3. The signals 404 (FIG. 9) are binary-encoded bits representing by their logic state a command for an increase with a signal of logic state I, or a decrease with a signal of logic state D, in the increment of signal $a(t)$ represented by each of the ADM signals $c$. Then, inspection of FIG. 9 indicates that the pattern controlled digital signals 404 from the pattern detector 76 (FIG. 3) follow the above stated 7-7-4-3 rule.

For example, from an initially preset increase signal I at 406, seven consecutive ADM signals $c$ of identical logic state occur to trigger a next digital increase signal I at 408. Then, continuing the example, four ADM signals of alternating logic state (including the last of the seven identical logic state ADM signals determining the pattern controlled increase signal I at 408) occur to trigger a pattern controlled digital decrease signal D at 410. The signals at 406, 408, and 410 thus illustrate the first portion of the above described 7-7-4-3 rule.

Now, the last pattern controlled digital signal D at 410 indicating a decrease in the increment represented by each succeeding ADM signal $c$, three consecutive ADM signals of identical logic state are required to trigger a pattern controlled digital signal indicating an increase in the increment represented by each succeeding ADM signal as shown by the pattern controlled digital signal I at 412. The signal I at 412 thus illustrates the second portion of the above described 7-7-4-3 rule.

The last pattern controlled digital signal at 412 now indicating an increase in the increment represented by each ADM signal, seven consecutive ADM signals of identical logic state are again required for a further signal indicating an increase in the increment represented by the ADM signal. As illustrated in FIG. 9, however, four ADM signals of alternate logic state first occur to trigger a digital pattern controlled signal D at 414 indicating a decrease in the increment represented by each succeeding ADM siganl. Three consecutive ADM signals of identical logic state are then required to trigger an increase in the increment represented by each pattern controlled digital signal as indicated by the signal I at 416.

In comparing the three consecutive ADM signals c triggering the pattern controlled digital increase signals I at 412 and 416, it is noted that the ADM signals triggering the pattern controlled signal I at 412 are of one logic state while those triggering the pattern controlled signal I at 416 are of the other logic state. This operation corresponds with that described with reference to FIG. 3 for the pattern detector 76 where it was noted that the pattern controlled signals represent the magnitude only of the increment represented by each ADM signal, the sign of the increment being separately introduced through delay device 90 and sign controlling, unity gain amplifier 84.

Then, as also described with reference to FIG. 3, the pattern controlled, signed, analog increment signals from amplifier 84 are provided to integrator 92 for integration into an analog signal corresponding to that represented by the successive ADM signals c. This analog signal $y(t)$ in the integrator 92 is shown as a function of time $t$ in FIG. 9 before being filtered by a smoothing filter (not shown) in the integrator 92 (FIG. 3) for output over the path 68 (FIG. 3). Then, as shown in FIG. 9, the magnitude of the increment in the signal $y(t)$ represented by each ADM signal is shown to be controlled by the pattern controlled digital signals 404. For example, the magnitude of the increment represented by one ADM signal c at 420 is indicated at 422 in signal $y(t)$ while an increaased increment represented by the next ADM signal c at 424, which follows the pattern controlled digital increase signal I at 412, is shown as the increased increment in the signal $y(t)$ at 426. It is also noted that the sign represented by the logic state of the ADM signal at 420 is delayed in delay device 90 (FIG. 3) to control the polarity of the next increment in the signal $y(t)$ at 426 while the sign represented by the ADM signal at 424 controls the polarity of a next increment 428 of signal $y(t)$, the size of the increment 428 being still controlled by the last preceding pattern controlled digital signal I at 412.

Table I

| Pattern Controlled Digital Signals | 7-7-4-3 Rule Controlling ADM Signal Pattern | | Pattern Controlled Digital signals |
|---|---|---|---|
| ...⇒I | 1 1 1 1 1 1 1 | ⇒ | I... |
| ...⇒I | 0 0 0 0 0 0 0 | ⇒ | I... |
| ...⇒D | 1 1 1 | ⇒ | I... |
| ...⇒D | 0 0 0 | ⇒ | I... |
| ...⇒I | 0 1 0 1 | ⇒ | D... |
| ...⇒I | 1 0 1 0 | ⇒ | D... |
| ...⇒D | 1 0 1 0 1 0 1 | ⇒ | D... |
| ...⇒D | 0 1 0 1 0 1 0 | ⇒ | D... |

Table I summarizes the earlier description of the 7-7-4-3 rule the operation of which in pattern detector 76 (FIG. 3) has just been described with reference to FIG. 9. At the left of Table I are shown the possible states of the last provided pattern controlled digital signals, for example signals 404 (FIG. 9), followed by the patterns of the ADM signals c controlling a next pattern controlled digital signal indicated at the right of the Table. Table I then indicates that three logic conditions are necessary to implement the 7-7-4-3 rule. These conditions are: determine the logic state of the previous pattern controlled digital signal as an increase signal I or a decrease signal D of the increment represented by each succeeding ADM signal; determine the pattern of the succeeding ADM signals; and determine the number of the ADM signals forming the pattern. Further inspection of Table I indicates that there are only 2 patterns of ADM signals to be detected, namely, identical or homogeneous logic states of the ADM signals and alternating logic states of the ADM isgnals. At the same time, it is observed that the number of ADM signals forming a controlling pattern requires counting the ADM signal bits forming the pattern and that determining the previous pattern controlled digital signal requires retention of the previous I or D digital signal.

FIG. 10 then shows a particular implementation of pattern detector 76 for the 7-7-4-3 rule summarized in Table I, it being recalled that the other pattern detectors 176, 276, and 376 of FIGS. 4, 6 and 7, respectively, are preferably identical. FIG. 10 then shows the ADM signals c input over the path 18 to the pattern detector as being provided to an input port of an exclusive OR gate 430 and to an input port of an inverting exclusive OR gate 432. The ADM signals c are also provided to an input port of a one-bit delay device 434. The delay device 434 delays each ADM signal input from the path 18 until the next ADM signal is received on the path 18 and then outputs the previous ADM signal to another input port of exclusive OR gates 430, 432. Each of the gates 430, 432 then simultaneously receives an ADM signal from the path 18 and the ADM signal previously on path 18 from the delay device 434. The delay device 434 may, for example, be a commercially available flip-flop responsive in logic state to the logic state of the input ADM signal from path 18 and operative at the leading edge of the clock signal to transfer data from the input to the output.

Then, in operation, the non-inverting exclusive OR gate simultaneously receives each successive ADM signal and the immediately preceding ADM signal to respond to the alternate logic states of the ADM signals with a logic one output on a path 436. Since each logic one output on the path 436 then represents an alternation in the logic states of consecutive ADM signals c on the path 18, the output signals from gate 430 are those from a detector 438 of alternating ADM signal patterns. Similarly, inverting exclusive OR gate 432 responds only to consecutive ADM signals c of identical logic state with a logic one signal on an output path 437 to thereby form a detector 440 of identical patterns of the ADM signals.

Each logic one signal on the path 436 from the alternating pattern detector 438 then corresponds to one alternation in the logic states of two consecutive ADM signals on the path 18. If a next or third ADM signal input on the path 18 again alternates in logic state from the immediately preceding or second ADM signal which triggered the first logic one onto the path 436, a second logic one signal is provided to path 436. Then extending this operation of pattern detector 438 to the seven alternating ADM signals indicated in the ADM signal pattern shown in the last row of Table I, it will be understood that the indicated pattern of ADM signals triggers six consecutive logic one signals onto the path 436.

The logic signals on path 436 are provided to a commercially available reversible or up-down three-bit counter 442 which increments in response to each logic one signal input on path 436. Each increment of the counter is binary encoded, the logic state of each bit of the counted increments being represented by a logic one signal at one of two discrete output ports of the counter, each pair of ports corresponding to one bit place of the counted alternating logic states of the ADM signals. For example, the pair of discrete output ports Q, $\overline{Q}$ each correspond to one bit place of the counted increments. A logic one signal at the port $\overline{Q}$ represents a count of one in the corresponding bit place while a logic one at the port Q represents a logic zero in the bit place. Following this scheme, a logic one signal from the port Q in the most significant bit (MSB) place, the port $\overline{Q}'$ in the next bit place, and the port Q'' in the least significant bit (LSB) place in counter 442 represents a binary-encoded count of 110 or six logic one signals input over the path 436, it being recalled that these six signals represent seven ADM signals c of alternating logic state input to the alternating pattern detector 438 over path 18.

Turning again to Table I, it is seen that the pattern of seven consecutive ADM signals of alternating logic state is a controlling pattern when, and only when, the preceding change in the signal increment represented by the ADM signals is a decrease in the size of the increment indicated by a pattern controlled digital signal D. Then, each of the ports Q, Q', $\overline{Q}''$ of counter 442 are connected over paths 446 to input ports of an AND gate 448. AND gate 448 is also connected to a path 450. A logic one signal on the path 450 represents, as will be described, an immediately preceding decrease in the signal increment represented by each ADM signal. AND gate 448 then provides a logic one signal over path 452 through an OR gate 454 to an output path 456. This signal is then a digital signal D controlled by the described pattern of seven alternating ADM signals as indicated in Table I.

The logic one signal on path 456 is provided to a reset port R of a flip-flop 460 to reset the flip-flop to provide a logic one signal to the path 450. Since it was earlier assumed that the path 450 already carried a logic one representing a prior decrease in the increment represented by each ADM signal, the logic one signal now on the path 450 in response to the logic one signal from path 456 does not represent a change in state of the signal from flip-flop 460.

The logic one signal on path 456 is also provided through an OR gate 462 to a reset port 463 of the counter 442 to reset the counter to its full zero count. Counter 442 is then reset for detecting a next pattern of the ADM signals.

If, on the other hand, the last preceding change in the size of the signal increment represented by each ADM signal had been an increase as represented by a signal I from flip-flop 460, no logic one signal will be carried on path 450 to AND gate 448. AND gate 448 will then not provide a logic one signal to the path 452 for output on path 456 through OR gate 454. However, a logic one signal representing the increase signal I is carried on a path 464 from flip-flop 460 to an input port of an AND gate 466. A review of Table I indicates that, following an increase in the signal increment represented by each ADM signal, the controlling pattern of ADM signals is four alternating logic states of consecutive ADM signals. The above description of the alternating pattern detector 438 indicates that this pattern of ADM signals is represented by three logic one signals on the path 436 to counter 442. Counter 442 counts these logic one signals to reach a binary-encoded count of three, 011 in binary notation, which, from the earlier description of counter 442, is seen to be provided by logic one signals from the ports $\overline{Q}$, Q', Q'', in sequence from the most significant bit (MSB) place to the least significant bit (LSB) place of counter 442. These ports $\overline{Q}$, Q' and Q'' are then connected over paths 468 to AND gate 466 and their logic one signals at the fourth of the alternating ADM signals together with the logic one signal on the path 464, the preceding increase signal I, trigger a logic one signal from AND gate 466. The signal from gate 466 is provided through OR gate 454 to the output path 456. As before described, the logic one signal on path 456 is a decrease signal D as indicated in Table I. Also as before described, the signal on path 456 is provided to port 463 to reset counter 442. The logic one signal on the path 456 is also provided to the reset port R of flip-flop 460 to provide a logic one signal to the path 450 from the flip-flop. Since it was initially assumed that path 464, and not path 450, carried a logic one signal, the logic one signal now provided to path 450 in a change of state in flip-flop 460.

Returning to the path 437 which, it will be recalled, receives logic one signals from inverting exclusive OR gate 432 in response to consecutive ADM signals c of identical logic state, it is seen that path 437 carries these logic one signals to an input port of a counter 470 which, like the counter 442, counts each successive logic one input signal. Turning to Table I, it is seen that, following an increase signal I, the controlling pattern of the ADM signals is seven consecutive ADM signals of identical logic state which, as with the logic one signals on path 436, will be represented by six logic one signals on the path 437. Accordingly, output ports q, q', $\overline{q}''$ corresponding to the most significant bit (MSB) place to the least significant bit (LSB) place of the counter 470 are connected to input ports of AND gate 480 via paths 482. AND gate 480 also receives the logic one signal on path 464 representing an immediately preceding increase in the signal increment represented by each ADM signal to then provide a logic one signal through an OR gate 484 to an output path 486 which signal then represents an increase signal I and an increase in the size of the increment represented by each following ADM signal.

The logic one signal on the path 486 is provided to a set port S of flip-flop 460 to set the flip-flop to provide a logic one signal to the path 464. This signal corresponds to the increase signal I to control the patterns of the following ADM signals to which the pattern detector responds. The logic one signal on path 486 is also provided through OR gate 492 to a reset port 493 of counter 470 to reset the counter to its full zero state.

It may now be quickly seen that the controlling pattern of three ADM signals of identical logic state following a decrease in the increment represented by each ADM signal as shown in Table I, will be indicated by two successive logic one signals on the path 437. These two signals on path 437 are counted in counter 470 to provide logic one signals at the ports $\bar{q}$, q', $\bar{q}''$ of the counter. These ports are connected via paths 488 to AND gate 490 which also receives the logic one signal on the path 460 which corresponds to the preceding decrease signal D. Gate 490 then provides a logic one signal through gate 484 to the set port S of flip-flop 460. Flip-flop 460 then changes state to provide a logic one signal to the path 464, corresponding to the increase in the increment represented by each following ADM signal now indicated by the signal on path 486.

From the above description of the 7-7-4-3 rule pattern detector, it may be seen that the initial, preset digital pattern controlled signal I at 406 (FIG. 9) may be introduced by a logic one signal on path 487 from a source (not shown) and appropriately timed with the first ADM signal c on path 18 to the pattern detector. The logic one signal on path 487 is provided to the set port S of flip-flop 460 to set the flip-flop to provide a logic one signal to path 464, which, as before described, is a digital signal I representing an increase in the increment of signal $y(t)$ (FIG. 9) as specifically shown at 406 (FIG. 9).

It is noted that the logic one signals on the path 436 are also provided through OR gate 492 to the reset port 493 of the counter 470 while the logic one signals on the path 437 are similarly provided through OR gate 462 to the reset port 463 of counter 442. Thus, each alternation of the logic states of consecutive ADM signals as indicated by a logic one signal from alternating pattern detector 438 on path 436 will reset counter 470, while each identical pattern of the logic states of the ADM signals as indicated by a logic one signal from identical pattern detector 440 on path 437 will similarly reset counter 442. These reset functions of the signals from pattern detectors 438, 440 disable each of the counters 442, 470 from responding to an interrupted pattern of alternating or identical ADM signals, it being noted that more than one signal on the paths 436, 437 is necessary to increment the respectively connected counters 442, 470 to a count triggering a logic one signal for output on paths 456, 486. For example, a detected identical pattern of ADM signals triggering a logic one signal onto the path 437 from identical pattern detector 440 followed by an ADM signal of alternate logic state triggering a logic one signal to the path 436 from alternating pattern detector 438 which is, in turn, followed by another identical pattern of ADM signals again triggering a logic one signal to path 437 from identical pattern detector 440 will not increment counter 470 to its two state because the logic one signal on path 436 between the logic one signals on path 437 reset counter 470 to its full zero state.

It is now seen that the logic one signals on output paths 486, 456 represent the digital signals, I, D controlled by the patterns of ADM signals input to the pattern detector 76 for indicating by their logic state (and path) an increase or decrease in the increment represented by each following ADM signal. These, then, are the signals earlier described for output path 78 (FIG. 3) which is now shown as discrete paths 456, 486 (FIG. 10).

DETAILED DESCRIPTION OF A 3-3-3-3 RULE PATTERN DETECTOR

Pattern detector 76 (FIG. 3) and, of course, corresponding pattern detectors 176, 276, 376 (FIGS. 5, 6, 7), may also be implemented to follow a 3-3-3-3 rule which may be described as follows:

If the last change in companding the ADM signals was to increase the step or signal increment represented by the pattern controlled signals, three consecutive ADM signals of identical logic state are required for a further increase, and three consecutive ADM signals of alternating logic state are required for a decrease in the step;

If, on the other hand, the last change in companding the ADM signals was to decrease the step or signal increment represented by the pattern controlled signals, three consecutive ADM signals of alternating logic state are required for a further decrease, and three consecutive ADM signals of identical logic state are required for an increase in the step.

Since the 3-3-3-3 rule described above does not depend on the last change in the increment represented by each following ADM signal and the corresponding pattern controlled increment signal, the rule may be abbreviated as follows:

Three consecutive ADM signals of identical logic state indicate an increase in the size of the increments represented by the pattern controlled signals and three consecutive ADM signals of alternating logic state indicate a decrease in the size of the increments represented by the pattern controlled signals.

Figure 11:
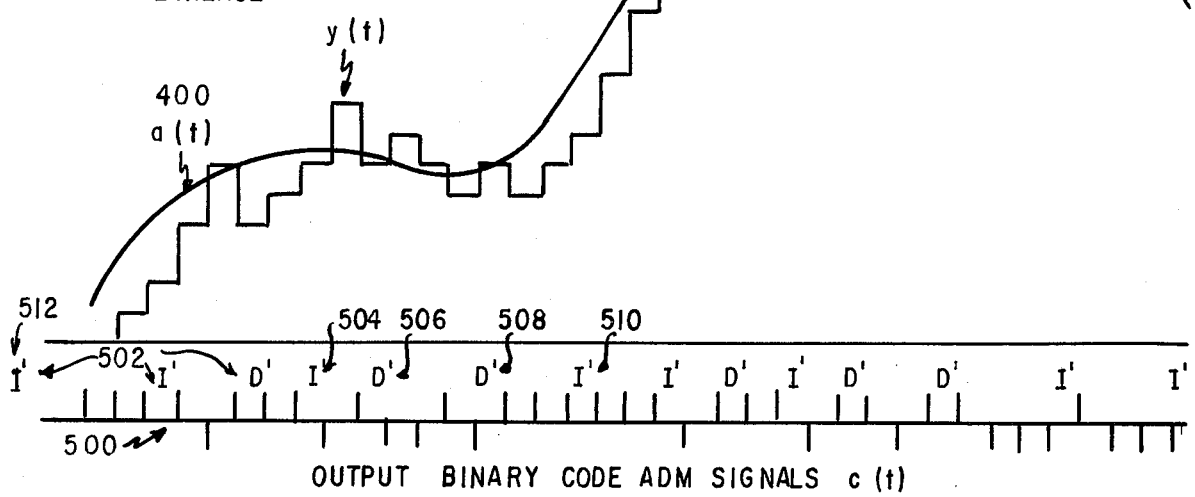
FIG. 11 illustrates signals from a pattern detector, for example the signal pattern detector shown in FIG. 3, which pattern detector is shown in detail in FIG. 12.

FIG. 11 illustrates the operation of the abovedescribed 3-3-3-3 rule for the arbitrary analog signal $a(t)$ again indicated at 400, as in FIG. 9 illustrating the earlier described 7-7-4-3 rule. The ADM signals c corresponding to the analog signal at 400 under the 3-3-3-3 rule are indicated at 500 with the signals I', D' representing, respectively, increases or decreases in the increment represented by each following ADM signal indicated at 502. Then, following the described 3-3-3-3 rule, it is seen that an increase signal I' at 504 followed by two consecutive ADM signals alternating in logic state from the last ADM signal preceding the increase signal at 504 and thereby forming three consecutive ADM signals alternating in logic state, provide a decrease signal D' at 506. Then, three more ADM signals of alternating logic state ignoring, as with the 7-7-4-3 rule, intervening ADM signals of identical logic state, trigger another decrease signal D' at 508 indicating a further decrease to the increment represented by each following ADM signal. Three consecutive ADM signals of identical logic state then provide the increase signal I' indicated at 510 representing an increase in the increment represented by the following ADM signals.

It is noted that an initial one of the pattern controlled signals 502 is, as in FIG. 9, indicated as a preset increase signal I' at 512. It is also noted that the signals I', D' are pattern controlled digital signals, like the signals I, D just described with reference to FIG. 10, but separately identified to indicate their compliance with the 3-3-3-3 rule. The analog signal increments derived from the ADM signal pattern controlled digital signals I', D' as integrated in integrator 92 (FIG. 3) but before filtering for output over path 68 (FIG. 3) are then indicated at $y'(t)$ (FIG. 11).

Figure 12:
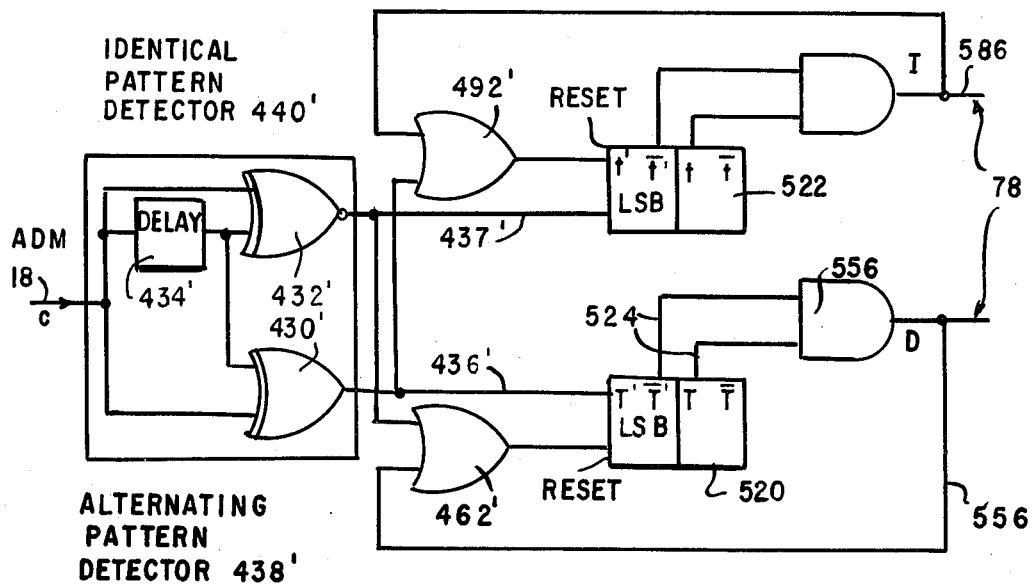
FIG. 12 shows detail of a pattern detector providing signals illustrated in FIG. 11.

A specific embodiment of pattern detector 76 implementing the described 3-3-3-3 rule is illustrated in FIG. 12. As shown in FIG. 12, pattern detector 76 receives the ADM signals c over the path 18 in an identical pattern detector 440' and alternating pattern detector 438' identical with the detectors 438, 440 described in detail with reference to FIG. 10. Without further description, it may then be stated that logic one signals on an output path 436' from the alternating pattern detector 438' represent consecutive ADM signals of alternating logic state while logic one signals on the path 437' from the identical pattern detector 440' represent consecutive ADM signals of identical logic state.

Path 436' is connected to a counter 520 while path 437' is connected to a similar counter 522. Inspection of FIG. 12 will reveal that the counters 520, 522 are symmetrically connected; therefore, only counter 520 need be described to also understand the operation of counter 522. A review of the above described 3-3-3-3 rule confirms the symmetrical operation of counters 520, 522 in response to alternating and identical patterns of ADM signals.

The logic one signals on path 436' representing alternating logic states of successive ADM signals are then provided to counter 520. Counter 520, like counters 442, 470 (FIG. 10), has discrete output ports for each bit place of the counter, for example, discrete ports T, $\overline{T}$ in the most significant bit (MSB) place of counter 520. A logic one signal from the port T indicates a count of one in the corresponding one from port $\overline{T}$ indicates a count of zero in the corresponding most significant bit place. Then, the desired controlling pattern of three consecutive alternating ADM signals provides, as described with reference to FIG. 10, two consecutive logic one signals from the alternating pattern detector 438' on the path 436' to counter 520. Counter 520 will count the input two logic one signals which, in binary format, are represented by a 10 signal. Accordingly, output ports T and $\overline{T}'$ of counter 520 are connected to output paths 524 to carry the logic one signals from prots T, T', representing in binary format a 10 count to AND gate 526 which then provides a logic one signal to an output path 556 which is the pattern controlled digital signal D' representing a detected pattern of three consecutive alternating ADM signals, as desired. Similarly, counter 522 will now be understood to provide a logic one signal to an output path 586 in response to a detected pattern of three consecutive ADM signals of identical logic state. The logic one signals on the paths 556, 586 are also provided to OR gates 462', 492', respectively, for providing a reset signal to the respectively connected one of the counters 520, 522. These reset signals will reset the counters to their full zero state, just as described with reference to counters 442, 470 (FIG. 10). Also in similarity with the pattern detector illustrated in FIG. 10, the output signals on the paths 556, 586 (FIG. 12) will be understood to represent the pattern controlled digital signals described for path 78 (FIG. 3).

DETAILED DESCRIPTION OF 2-2-2-2 RULE PATTERN DETECTOR

The minimum distinguishing pattern of ADM signals c is, of course, a pattern of two consecutive ADM signals. The 2-2-2-2 rule implements this scheme for patterns of two consecutive ADM signals of alternating logic states and for two consecutive ADM signals of identical or logic state. Therefore, the rule may be stated as:

Two consecutive ADM signals of identical logic state require an increase in the increment represented by each following ADM signal;

Two consecutive ADM signals of alternating logic state require a decrease in the signal increment represented by each following ADM signal.

Figure 13:
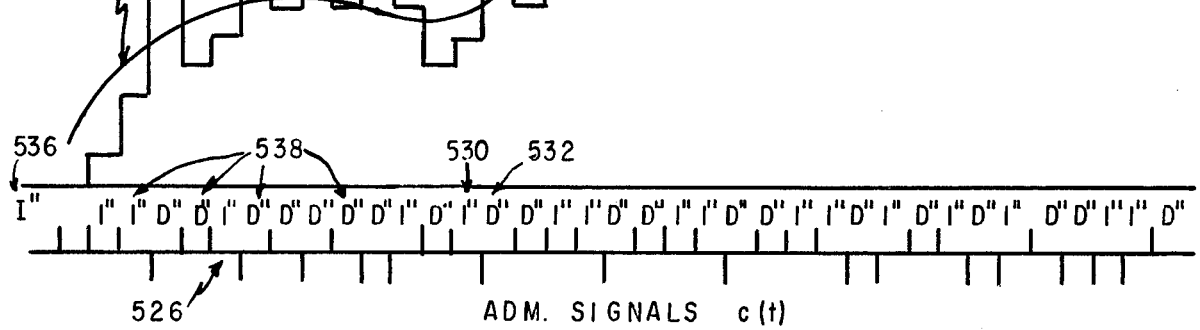
FIG. 13 illustrates signals from a signal pattern detector, for example the signal pattern detector shown in FIG. 3, which pattern detector is shown in detail in FIG. 14.

FIG. 13 shows the application of this 2-2-2-2 rule to analog signal a(t) again shown at 400. The ADM signals c on the path 18 (FIG. 3) are shown at 526 with corresponding pattern controlled signals I'', D'' output from a 2-2-2-2 rule embodiment of pattern detector 76 indicated at 528. Then, following the described 2-2-2-2 rule, it is seen that two consecutive ADM signals c of identical logic state trigger a signal I'', for example at 530, indicating an increase in the signal increment represented by each successive ADM signal, while two consecutive ADM signals c of alternating logic state trigger a signal D'', for example at 532, indicating a decrease in the increment represented by each successive ADM signal. After delayed application of the sign of the corresponding ADM signal in the sign controlled unity gain amplifier 84 (FIG. 3) and before a smoothing filter (not shown) in integrator 92 (FIG. 3), the signal y''(t) controlled by the digital pattern controlled signals 528 are indicated at 534 in FIG. 13. In similarity with FIGS. 9 and 11, an initial preset signal I'' indicating an increase in the increment represented by the following ADM signals is indicated at 536. It is noted that the digital pattern controlled signals I'', D'' are the same as the digital pattern controlled signals I, D (FIG. 11) but are distinctly referenced in FIG. 13 to indicate their compliance with the 2-2-2-2 rule.

Figure 14:
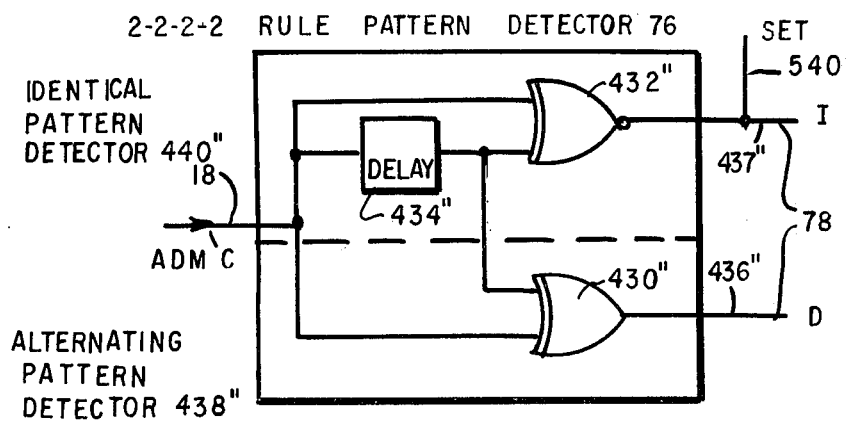
FIG. 14 shows detail of a pattern detector providing signals illustrated in FIG. 13.

FIG. 14 shows an embodiment of pattern detector 76 implementing the above-described 2-2-2-2 rule for detecting patterns of ADM signals c input over path 18. The embodiment will immediately be recognized as identical pattern detector 440 and alternating pattern detector 438 earlier described in detail with reference to FIG. 10.

Then, as earlier described, each logic one signal output on path 436'' from the alternating pattern detector 438'' represents consecutive ADM signals c input on path 18 of alternating logic state while each logic one output signal on path 437'' from identical pattern detector 440'' represents consecutive input ADM signal c of identical logic state. This description will now be seen to correspond to that of the 2-2-2-2 rule which is thus implemented by the embodiment shown in FIG. 14. Since the embodiment has been earlier described with reference to FIG. 10, no further description is now necessary except to note that the initial pattern controlled signal I'' indicated at 536 (FIG. 13) may be introduced directly to path 437'' over a path 540 from a device (not shown) responsive to the initial operation of the system. Since the signals on the paths 436'', 437'' are the pattern controlled digital increase signals I'' and decrease signals D'', respectively, paths 436'', 437'' are the output path 78 (FIG. 3) of the pattern detector 76 for implementing the described 2-2-2-2 rule of pattern detection.

MORE DETAILED DESCRIPTION OF THE DIGITAL-TO-ANALOG CONVERTER

The analog to ADM converter 16 earlier described with reference to FIG. 3 has a digital-to-analog converter 80 receiving the pattern controlled digital signals on path 78 from the pattern detector 76, several embodiments of which have just been described in detail. The converter 80 provides analog signals controlled by the digital pattern controlled signals which, then, are the pattern controlled analog signals on the path 82 which have a magnitude or amplitude corresponding to that represented by a corresponding ADM signal c. Similarly, the ADM to analog converter 56 shown in FIG. 7 was earlier described as having a digital-to-analog converter 380 providing pattern controlled analog signals to an output path 382 in response to pattern controlled digital signals input to the converter 380 over path 378 from pattern detector 376. In the earlier description of converter 16 (FIG. 3) and converter 56 (FIG. 7) it was noted that a portion 350 (FIG. 3) of the converter 16 including digital-to-analog converter 80 was identical to the converter 56 (FIG. 7). Therefore, only the digital-to-analog converter 80 shown in FIG. 3 need be described in detail, it being understood that digital-to-analog converter 380 shown in FIG. 7 may be similarly implemented.

Then, as earlier described with reference to FIG. 3, it is the function of the digital-to-analog converter 80 to provide analog signals to the path 82 having a magnitude controlled by detected patterns of the ADM signals as represented by the pattern controlled digital signals introduced to the converter over path 78. The pattern controlled analog signals on the path 82, as earlier described, receive a polarity or sign from amplifier 84 and are then provided over path 88 to integrator 92 to form a step or increment of signals $y(t)$, $y'(t)$ and $y''(t)$ (FIGS. 9, 11 and 13, respectively) from each of the pattern controlled analog signals. The amplitude of each pattern controlled analog signal determines the size of the corresponding step or increment of the integrated signals while the sign or polarity of the pattern controlled analog signal determines the direction of the step.

In the description of the art, it was also noted that it was known to be desirable to provide logarithmically related steps to an ADM signal companding scheme. This logarithmic companding of the ADM signals, as with logarithmic compression of pulse code modulated signals by, for example, the above-described mu-law or A-law used for encoding CPCM signals in commercial telephone systems, has the advantage of providing a constant signal to quantization noise ratio over a wide dynamic signal range. Since the pattern controlled analog signals here described control the size of the signal steps represented by each ADM signal, the desirable logarithmic relation of the steps may be provided by the digital-to-analog converter 80 which provides the pattern controlled analog signals determining the size of the signal steps.

Table II

| Total Levels of Signal Increment Increase or Decrease | Relative Analog Output Signal Amplitude | The Corresponding Analog Signal Amplitude in Eight Bit Binary Notation |
|---|---|---|
| 000 | $2^0$ | 00000001 |
| 001 | $2^1$ | 00000010 |
| 010 | $2^2$ | 00000100 |
| 011 | $2^3$ | 00001000 |
| 100 | $2^4$ | 00010000 |
| 101 | $2^5$ | 00100000 |
| 110 | $2^6$ | 01000000 |
| 111 | $2^7$ | 10000000 |

Then, for the desired logarithmic operation of the digital-to-analog converter 80, the total levels of pattern controlled digital signals I, D which control the total increase or decrease in the amplitude of the corresponding pattern controlled analog signal output over path 82 (FIG. 3) are shown in Table II. It has further been determined to constrain the range of analog signal amplitudes output from the digital-to-analog converter 80 to the eight levels indicated in Table II. Then, for example, two digital increase signals I and one decrease signal D will provide a total signal increment increase of one level or, for example, from the level 001 to the level 010 indicated in Table II. The levels of single increment increase or decrease indicated in Table II are shown in binary notation to indicate their ready implementation by a 3-bit up-down counter.

It has been already noted that the pattern controlled digital signal I', I'', D', D'' shown in FIGS. 11 and 13 are the same signals as the pattern controlled digital signals I, D described with reference to FIG. 9, the signals being separately identified only on the basis of the pattern detector implementing the signals. Table II is thus adequate to describe the operation of a digital-to-analog converter 80 which is compatible with each of the pattern detectors described with reference to FIGS. 10, 12 and 14.

Table II suggests two modes of implementing the desired analog output signal amplitudes. In a first, linear mode, the desired analog signal amplitudes are seen to be selected ones of the 256 possible analog signal outputs from an 8-bit linear digital-to-analog converter, the 8-bit digital signals corresponding to the desired analog output signal amplitudes being indicated in Table II. On the other hand, the binary indication of the total levels of signal increment increase or decrease corresponding to the desired analog output signal amplitude suggests a 3-bit exponentially non-linear digital-to-analog converter.

LINEAR IMPLEMENTATION OF LOGARITHMIC DIGITAL-TO-ANALOG CONVERTER

Turning first to the suggested linear implementation of the desired analog output signal amplitudes, FIG. 15 shows one embodiment of the linear digital-to-analog converter 80 (FIG. 3). In FIG. 15 the path 78 from the pattern detector 76 (FIG. 3) is indicated as the discrete paths 436''. 438'' from the 2-2-2-2 rule pattern detector described with reference to FIG. 14. However, it should be understood that the 2-2-2-2 rule pattern detector is merely exemplary, the pattern detectors described with reference to FIGS. 10 and 12 being equally appropriate to provide signals over their output paths 436, 438 (FIG. 10) and 436', 438' (FIG. 12) corresponding, as described, to the indicated path 78.

Then, as described for the 2-2-2-2 rule pattern detector shown in FIG. 14, the path 436'' carries logic one signals D indicating a decrease in the increment represented by each following ADM signal while path 437'' carries logic one signals I indicating an increase in the increment represented by the following ADM signals. The signals D on path 436'' are provided to a port 600 of a counter 602 to decrement or down-count the counter while the signals I on the path 437'' are provided to a port 604 of counter 602 to increment or up-count counter. Counter 602 is a commercially available 3-bit parallel output reversible counter then providing the eight combinations of binary-encoded signals to three output paths 606 representing the levels of the detected patterns indicated in Table II. The counter 602 additionally has means to retain the counter count at its full zero state when a next signal on the path 436'' indicates further decrement to the count in the counter and means to hold the count in the counter at its full one state when a next signal on path 437'' indicates a further counter increment. Counter 602 will not then overflow from either its full zero nor full one condition.

The levels of the signal increment then indicated by successive signals on the paths 606 from the counter 602 are provided to a 3-bit to 8-bit parallel signal decoder 608 which decodes the binary input signals from the paths 606 into a single logic level signal on a corresponding one of eight discrete output paths 610. Decoders of the type 608 are commercially available, one being designated SN74155 and available from Texas Instruments Incorporated.

The signal then provided to one of the eight discrete paths 610 is carried on the path to one of 8 parallel input ports of a linear digital-to-analog converter signal values shown in Table II from the converter 612. The 8-bit D/A converter is a commercially available standard building block, one of which is MC1408L from Motorola semiconductors.

A review of the indicated 8-bit signals shown in Table II suggests another linear implementation of the digital-to-analog converter 80 which is shown in FIG. 16. FIG. 16 again shows the 2-2-2-2 rule pattern detector 76 shown in FIG. 14 as a selected example of the other pattern detectors shown in FIGS. 10 and 12 for providing pattern controlled signals I'' to path 437'' indicating an increase in the increment represented by each following ADM signal and signals D'' to a path 436'' indicating a decrease in the increment represented by each following ADM signal. As shown in FIG. 16 the signals D'' on the path 436'' are provided to a port 620 of an 8-bit shift register 622 for shifting each data bit in the shift register 622 to the left, toward the indicated least significant bit (LSB) bit place 624. On the other hand, the signals I'' on the path 437'' are provided to a port 626 for shifting the data bits in shift register 622 to the right, towards the indicated most significant bit (MSB) place 628. The shift register 622 also receives a reset signal over path 630 through OR gate 632 for initially setting the bit in the least significant bit place 624 to a logic one and the bit in each of the seven other bit places through and including the most significant bit place 628 to a logic zero. Then, each signal I'' on the path 437'' shifts the single logic one signal in shift register 622 from the least significant bit place 624 one bit place to the right to successively provide a signal stored in shift register 622 corresponding to each of the indicated 8-bit signals shown in Table II. Similarly, each signal D'' on the path 436 shifts the signal in the shift register 622 one bit place to the left corresponding to moving one level up the 8-bit signals shown in Table II.

When a logic one bit appears in the least significant bit place 624 of register 622, it is retained in the register, but also provided from the register over path 634 to a trigger 636. Trigger 636 also receives the increment decrease signals D'' from path 436'', which, as just described, shift the data bits in shift register 622 to the left toward the least significant bit place 624. However, the logic one signal in shift register 622 has already reached the least significant bit place to provide the signal over path 634. Further left shifting of the logic one bit is then inappropriate and trigger 636 responds to the signal over path 634 and a further signal D'' indicating a further left shift for the logic one in bit place 624 with an output signal carried over path 640 through OR gate 632 which, as described for the reset signal over path 630, resets the shift register 622 to a logic one bit in the least significant bit place 624 and a logic zero bit in each of the other bit places through and including the most significant bit place 628.

If, on the other hand, the logic one bit in shift register 622 has been shifted to the most significant bit place 628, further right shift of the logic one signal is inappropriate and the shift register 622 provides a signal over a path 642 to a trigger 644. Trigger 644 also receives the signals I'' from the path 437'' indicating further right shift for the logic one bit in the shift register 622 to then respond to the presence of the logic one bit in the most significant bit place 628 and the further right shift indicated by the signal I'' on path 437'' with a signal provided over path 646 to the shift register 622 to reset a logic one in only the most significant bit place 628. Triggers 636 and 644 thus prevent overflow of the logic one bit from shift register 622.

Shift register 622 also receives a clock signal (not shown) which sequentially shifts each of the eight data bits in shift register 622 to an output path 650. The output path 650 is shown to be connected as an input to the shift register 622 which is thus restored to its original condition after each data bit in the shift register has been output over path 650. Output path 650 is also connected to an 8-bit linear digital-to-analog converter 652. Since the data bits in register 622 always correspond to one of the 8-bit signals indicated in Table II, the 8-bit linear digital-to-analog converter 652 then provides a corresponding one of the output analog signal amplitudes, also indicated in Table II, to the output path 82. The 8-bit digital-to-analog converter 652 is commercially available. Since the ADM Signals producing the indicated increase or decrease signals I'', D'' have been earlier described to be at 56KHz, the maximum frequency of the signals I'', D'' and thus the maximum rate of change of the digital signal input to the digital-to-analog converter 652 over path 650 is 56KHz which indicates a 17.8 microsecond period for each analog conversion of an 8-bit digital input signal. This time interval will be recognized to be well within the capabilities of many commercially available, 8-bit digital-to-analog converters.

NON-LINEAR IMPLEMENTATION

Table II also suggests that the total levels of increments represented by successive ADM signals may be accumulated in a 3-bit up-down counter as, for example, the counter 602 (FIG. 15). The 3-bit signals from the counter could then be provided to a 3-bit digital-to-analog converter providing, directly, the indicated exponential output analog signals. However, such 3-bit exponential digital-to-analog converters are not generally commercially available.

One specific implementation of a 3-bit exponential digital-to-analog converter (not shown) has three analog switches (not shown) and means (not shown) for non-linearly operating on analog signals carried through selected ones of the switches closed in response to the indicated 3-bit signals from a counter representing as in counter 602 (FIG. 15) the levels of the desired analog signal amplitudes. Unfortunately, stability and reliability are hard to maintain for non-linear manipulation of analog signals. However, an alternate approach uses digital circuits to perform the required non-linear control of the digital-to-analog converter. As opposed to the difficult non-linear control of analog signal amplitudes, the basic idea of this approach is to have non-linear digital control of the timing of constant analog signal sources. Specifically it will be shown that digital control of constant current sources will provide a charge to a capacitor having the desired exponential relation shown in Table II. Of course, it will be understood that the scheme to be described could be implemented with means other than a capacitor for accumulating the time controlled analog output signal without departing from the scope of the inventive technique. It will also be understood that the number of constant signal sources may be any number of constant signal sources of one or more; however, as will be later described, the speed with which timing control of the analog signal sources must be accomplished is inversely related to the number of analog signal sources. Those in the art are well aware that higher speed switching devices are more difficult to implement and more costly than their lower speed counterparts requiring, for example, special switching transistors with low parasitic and stray capacitances for their implementation. Accordingly a specific number of current sources is only a design consideration, depending on the relative cost of current switches and current sources.

FIG. 17 then illustrates one exemplary implementation of the above-described technique of digital time control of a constant signal source for the implementation of a logarithmically non-linear digital-to-analog converter 80. In the illustrated embodiment the constant signal source is a constant current source 660 providing two, related constant currents $I_1$, $I_2$ each of which is switched on or off by digital switches 662, 664, for providing a corresponding output current over path 666 for charging a capacitor 668 to a potential which will be shown to be the logarithmically related analog signals desired for output from digital-to-analog converter 80 over path 82. The digital controls at 670 for the digitally controlled switches 662, 664 are shown to provide four digitally controlled time signals at times $t_1$, $t_2$, $t_3$ or $t_4$ which open one of the switches 662, 664, one of which was closed by a digital signal at an initial time $t_o$ to define four time intervals $t_n - t_o$ during which one of the charging currents $I_1$, $I_2$ charges capacitor 668. These time intervals $t_n - t_o$ are then given by:

$$t_4 - t_o = T \quad (A)$$
$$t_3 - t_o = 2^{-1} T \quad (B)$$
$$t_2 - t_o = 2^{-2} T \quad (D)$$
$$t_1 - t_o = 2^{-3} T \quad (E)$$

where T is a constant time less than or equal to the time between successive ADM signals defining the maximum time interval during which the digital-to-analog converter 80 must provide the pattern controlled analog signal increment represented be each ADM signal. For the earlier indicated 56 KHz ADM signals, the time T is then less than or equal to 17.8 microseconds.

If the relationship of constant currents $I_1$, $I_2$ is selected to be given by:

$$I_2 = \frac{1}{16} I_1 \equiv 2^{-4} I_1, \quad (F)$$

the potential V placed on capacitor 668 having a capacitance C during each of the time intervals $t_n - t_o$ may be computed from its well-known relationship to capacitor charging current i given by:

$$V = \frac{1}{C} \int_{t_o}^{t_n} I dt \equiv \frac{I(t_n - t_o)}{C} \quad (G).$$

Then, from the selected time intervals given in equations (A) (B) (D) (E) and the current relationship given in equation (F), it may be shown that Table III shows the potential V accumulated on capacitor 668 when the indicated one of input currents $I_1$, $I_2$ is applied to the capacitor 668 for an indicated time interval $t_n - t_o$ where K is a constant given by:

$$K \equiv \left(\frac{I_1 T}{C}\right) 2^{-7} \quad (H).$$

The potentials V shown to be on capacitor 668 in Table III are then seen to have the exponential relation earlier shown in Table II as desirable for the analog signal increments output over path 82.

Table III

| Input Current | Time Interval $t_n - t_o$ of current input | Potential V on Capacitor 668 |
|---|---|---|
| $I_2$ | $t_1 - t_o$ | $2^0 K$ |
| $I_2$ | $t_2 - t_o$ | $2^1 K$ |
| $I_2$ | $t_3 - t_o$ | $2^2 K$ |
| $I_2$ | $t_4 - t_o$ | $2^3 K$ |
| $I_1$ | $t_1 - t_o$ | $2^4 K$ |
| $I_1$ | $t_2 - t_o$ | $2^5 K$ |
| $I_1$ | $t_3 - t_o$ | $2^6 K$ |
| $I_1$ | $t_4 - t_o$ | $2^7 K$ |

To achieve the desired digital control of the time intervals during which one of the switch devices 662,

664 provides one of the charging currents $I_1$, $I_2$ to capacitor 668, FIG. 17 shows an 8-bit shift register 662' operated by the digital pattern controlled signals I, D from the pattern detector 76 (FIG. 3) exactly as earlier described with reference to FIG. 16 for the shift register 622. Shift register 622', like shift register 622 (FIG. 16), has only one logic bit which is shifted through the register toward or away from a most significant bit place 628' in response to the pattern controlled digital signals I, D, respectively, which are provided to shift register 622' over path 78 (also shown in FIG. 3).

The logic one signal and the remaining logic zero signals in each of the eight bit places of shift register 622' are provided over discrete paths 672, 674 to a 4-bit digital comparator 676, the first four bits from the most significant bit place 628' toward the least significant bit place 624' being provided over discrete paths 672 to each of four discrete input ports 678 of digital comparator 676 and the next four bits toward the least significant bit place 624' being respectively provided to the same discrete ports 678 over paths 674. Digital comparitor 676 also receives at input ports 680 corresponding to the ports 678 logic signals input over four parallel paths 682 from output ports of a 4-bit counter 684. The digital comparator 676 then compares the logic state of each bit provided to the ports 680 over paths 682 from counter 684 with the logic state of the bits input at the ports 678 input over paths 672, 674 from the shift register 622'. When, and only when, the logic state of each bit input to each corresponding one of the ports 678, 680 of comparator 676 corresponds, the digital comparator 676 provides a logic one signal over an output path 686.

This logic one signal is provided to a port 688 of counter 684. Counter 684 also receives a signal over path 690 from a clock (not shown) which resets the counter to its full zero state and enables counting operation of the counter until a logic one signal is received at port 688. Since the digital-to-analog converter 80 is intended to provide an analog signal corresponding to the signal increment represented by each of the ADM signals and, as earlier described, the ADM signals were suggested to be at the 56 KHz frequency of commercial $T_1$ telephone lines, the enabling or set signal provided on path 690 is also at 56 KHz to enable counter 684 during each ADM signal interval. Counter 684 also receives a signal over path 692 from another clock (not shown) to increment the counter. To assure that a logic one signal appears on each of the four output paths 682 from counter 684 at least once during each ADM signal interval, counter 684 must reach a count of eight, 1000 in binary format, during each of the 56 KHz ADM signal intervals. Therefore, the counter incrementing signals provided over path 692 are at 448 KHz.

The paths 672, 674 earlier described as connecting the shift register 622' to the digital comparator 676 also connect each bit place of the shift register 622' to OR gates 694, 696, respectively. Since shift register 622' has only one logic one signal in one bit place, only one of the OR gates 694, 696 will provide a logic one signal at any one time to output paths 698, 700 connected, respectively, to the OR gates 694, 696.

Path 698 is connected to an AND gate 702 while path 700 is connected to an AND gate 704. AND gate 702 also receives the logic signals output from the digital comparator over path 686 at an inverting port 706. Then, until counter 684 provides output signals over paths 682 which correspond to those provided from the shift register 622' over paths 672, 674, the digital comparator 676 provides, as described, a logic zero signal over path 686 which is inverted at port 706 of AND gate 702 to trigger a logic one signal from gate 702 over a path 708 to analog switch device 662. Analog switch device 662 receives constant current $I_1$ over a path 710 and responds to the logic one signal over path 708 to provide the current $I_1$ to the output path 666 for charging capacitor 668.

The current $I_1$ from the constant current source 660 is also provided to potential dividing resistors 712, 714 which have a resistance ratio of 15/1 to provide the current $I_2$ to path 716 at the current relationship given by equation (F). The current $I_2$ on path 716 is provided to analog switch device 664 which is enabled by a logic one signal from gate 704 to provide the current $I_2$ to the output path 666. AND gate 704 responds to a logic one signal over path 700 and the logic zero signal over path 686 to provide the logic one signal to analog switch device 664 in similar fashion to that just described for analog switch device 662 and AND gate 702.

An example of the operation of the digital-to-analog converter 80 just described will best indicate its implementation of the desired operation characteristics indicated in Table III. As an example, it is assumed that the shift register 622' contains the word 00001000 in response to a total level of the digital pattern controlled signals input over the path 78. Since the single logic one bit in shift register 622' is in the fifth bit place from the most significant bit place 628', it will then be carried over one path 674 through OR gate 696 and then on path 700 to AND gate 704.

At the same time the signal over path 690 enables counter 684 to increment in response to each successive signal from path 692. The signal on path 690 also resets the counter 684 to its full zero state to initially provide all logic zero signals over paths 682 to the digital comparator 676. These logic zero signals clearly do not correspond to the 1000 signal introduced to the digital comparator 676 over paths 674, each input over the paths 672 being a logic zero as indicated by the initial four zeros of the word 00001000 assumed to be in the shift register 622'. The digital comparator then provides a logic zero signal over path 686 to the inverting input port of AND gate 704. AND gate 704 responds to this inverted logic zero signal and the logic one signal provided from path 700, just described, to provide a logic one signal to analog switch device 664. Switch device 664 responds to the logic one signal to provide current $I_2$ received over path 716 to output path 666 for charging capacitor 668. The logic one signal from gate 704 thus defines time $t_o$ for this operation of converter 80.

At the same time it is noted that paths 672 provide only logic zero signals to OR gate 694 which then provides a logic zero over path 698 to AND gate 702. AND gate 702 then provides a logic zero over path 708 to analog switch device 662 which then blocks current $I_1$ from the output path 666. Thus, only current $I_2$ is provided to the capacitor 668.

As just described, counter 684 was enabled at time $t_o$ by the signal over path 690 to increment in response to each signal over path 692. Only when the counter 684 increments to a count of 1000 at the eighth signal over path 692 following time $t_o$ will the number in the counter 684 as provided over paths 682 to ports 680 of the digital comparator 676 correspond to the 1000 signal input paths 674 to the input ports 678 of the digital comparator 676. The 1000 signal to the digital comparator 676 from shift register 622', being the largest signal which the single logic one bit in the shift register 622' can provide to the digital comparator 676, therefore defines a maximum time interval during which the count in the counter 684 must increment into correspondence with the signal input to the digital comparator 676 from the shift register 622'. This maximum time interval is then the full time interval T defined by time $t_4$ (Equation A) for charging capacitor 668.

When the counter 684 increments to a count of 1000, the signal input to digital comparator 676 from the counter corresponds to that from shift register 622'. The digital comparator 676 then responds with a logic one signal to output paths 686. The logic one signal on path 686 then causes AND gate 704 to provide a logic zero signal to analog switch device 664 which then blocks constant current $I_2$ from the output path 666. However, the logic one signal over path 686 will not trigger a logic one signal from AND 702 because it still receives the logic zero signal from path 698. As thus described constant current $I_2$ has been provided to capacitor 668 for a time interval $t_4 - t_o$ which, as shown in Table III, provides a potential equal to $2^3K$ to capacitor 668.

The logic one signal on path 686 is also provided to reset port 688 of counter 684 to disable the counter from counting further signals input from path 692 until a next signal from path 690 again enables the counter, after resetting the counter to its full zero state, thereby defining a next time $t_o$ initiating a next charging interval for capacitor 668. Means (not shown) may be provided to reset the capacitor at the beginning of the system operation and whenever the LPCM signal on path 26 of the ADM to LPCM converter 24 reaches a value corresponding to a zero magnitude to insure alignment of the system operation.

From the description of the digital-to-analog converter 80 with reference to FIG. 17, it may be seen that each of the other time intervals and charging currents indicated in Table III will be selected by other digital pattern controlled signals introduced to shift register 622' over path 78. Capacitor 668 will then be charged to a potential corresponding to the charging current and time interval selected by the pattern controlled signal in the shift register. Therefore, the potential on the path 82 is an analog signal controlled by the patterns of the ADM signals as detected by the pattern detector 76 (FIG. 3) generating the digital pattern controlled signals which are provided to shift register 622' over path 78.

SUMMARY OF THE PREFERRED EMBODIMENTS

The preferred embodiments just described form the communication system illustrated in FIGS. 1 and 2. This system has sending path having particular utility for converting analog input signals such as voice signals into ADM signals in a subscriber switch of a telephone system. The ADM signals are then transmitted on a T1 transmission line which carries the ADM signals to a central office of the telephone system. At the central office the ADM signals are converted into CPCM signals compatible with commercial telephone equipment. The CPCM signals may then be transmitted over span lines to another office in a receiving path of the telephone system where they are converted into ADM signals for transmission over another T1 line to another subscriber switch where the ADM signals are converted into analog signals substantially corresponding to those originally input to the system. It is specifically noted that the coding and decoding of signals in the system does not require digital to analog and analog to digital conversion to change the coding format from ADM to CPCM and from CPCM to ADM in the central office. Furthermore, the digital processing equipments 24, 28, 32, and 36 in central office 22 of FIG. 1 and 40, 44, 48 and 52 in central office 22' of FIG. 2 for performing digital code conversion can be designed to be shared between several channels which has significant economic advantage by counting only the amount of analog to digital (A/D) and digital to analog converters (D/A) it can save. Since 22 and 22' are common equipment in the central office and only digital processing is involved, it can also be designed to perform better, that is have better signal to noise ratio performance, than as in conventional means, by going through D/A and A/D convertors.

In the described communication system it was specifically noted that similar building blocks were used to reversibly convert analog to ADM signals and to reversibly convert ADM to LPCM signals, which permits the encoder and decoder portions of the system to be similarly implemented thereby achieving, in addition to their unique design, direct or plug-for-plug compatibility with each other.

Finally, three specific embodiments of digital-to-analog converters were described. Each embodiment of the digital-to-analog converter was responsive to the digital pattern controlled signals from the described pattern detectors to provide a pattern controlled analog signal, thus achieving direct or plug-for-plug compatibility with each other as well as with the described pattern detectors.

Having thus described my invention what I claim is:

1. In a telephone communication system having a plurality of transmission lines over which voice signals are transmitted in an adaptive delta modulation code, the improvement comprising sending means including first digital converter means for converting said adaptive delta modulation signals received over one of said transmission lines to linear pulse code modulation signals, first filter means connected to the output of said first digital converter means for smoothing the signals output from said digital converter means, first speed converter means connected to the output of said first filter means for decreasing the speed of the signals output from said filter means to a value compatible for use with a pulse code modulation communication system; and receiving means including second speed converter means, input means for providing said pulse code modulation signals from said communication system to said second speed converter means, second filter means connected to the output of said second speed converter means for smoothing the signals output therefrom, and second digital converter means for converting the pulse code modulation signals output from said second filter means to adaptive delta modulation signals for transmission over a second one of said transmission lines.

2. A telephone communication system as set forth in claim 1 wherein said sending means additionally includes analog-to-adaptive delta modulation converter means receiving said voice signals in analog format and converting said voice signals to said adaptive delta modulation signals for transmission over said one transmission line to said first digital converter means.

3. A telephone communication system as set forth in claim 1 wherein said receiving path additionally includes adaptive delta modulation-to-analog signal converter means connected to receive the adaptive delta modulation signals output over said second one of said transmission lines for converting said adaptive delta modulation signals to analog signals for output from the system.

4. In a telephone communication system having a plurality of transmission lines over which voice signals are transmitted in an adaptive delta modulation code, the improvement comprising sending means including digital converter means for converting said adaptive delta modulation signals received over one of said transmission lines to linear pulse code modulation signals, filter means connected to the output of said digital converter means for smoothing the signals output from said digital converter means, and speed converter means connected to the output of said filter means for decreasing the speed of the signals output from said filter means to a value compatible for use with a pulse code modulation telephone system.

5. A telephone communication system as set forth in claim 4 wherein said digital converter means includes pattern detection means for detecting predetermined patterns of said adaptive delta modulation signals received over said one of said transmission lines to produce step size control signals, and means responsive to said step size control signals for providing said linear pulse code modulated signals.

6. A telephone communication system as set forth in claim 5 wherein said adaptive delta modulation signals have encoded logic states, and wherein said pattern detection means includes means connected to receive said adaptive delta modulation signals for providing digital signals discretely indicating identical and alternating logic states of consecutive ones of said adaptive delta modulation signals, means for counting said digital signals indicating said identical logic states of said consecutive adaptive delta modulation signals and for counting said digital signals indicating said alternating logic states of said consecutive adaptive delta modulation signals, bistable means for storing said step size control signals with states which indicate an increase or a decrease in an increment to said linear pulse code modulated signal represented by a last detected pattern of said adaptive delta modulation signals, and means responsive to the state of said bistable means and to preselected counts of said counted identical and alternating logic states of said consecutive adaptive delta modulation signal for providing said step size control signals.

7. A system as set forth in claim 5 wherein said adaptive delta modulation signals have encoded logic states and wherein said pattern detection means includes means connected to receive said adaptive delta modulation signals for providing digital signals discretely indicating identical and alternating logic states of consecutive ones of said adaptive delta modulation signals, and means responsive to a preselected number of said digital signals indicating said identical and alternating logic states of said consecutive adaptive delta modulation signals for providing step size control signals.

8. A telephone communication system as set forth in claim 5 wherein said adaptive delta modulation signals have encoded logic states and wherein said pattern detection means includes means detecting identical and alternating logic states of consecutive ones of said adaptive delta modulation signals.

9. A telephone communication system as set forth in claim 4 in which said sending means additionally includes subscriber terminal means having input means over which said voice signals are received in analog format, and further converter means connected to said input means for converting said voice signals to adaptive delta modulation signals for output from said further converter means over said one of said transmission lines to said digital converter means.

10. A telephone communication system as set forth in claim 9 in which said sending means additionally includes output converter means connected to receive said signals from said speed converter means for converting said signals from said speed converter means into compressed pulse code modulation signals for use with said pulse code modulation telephone system.

11. A telephone system as set forth in claim 9 wherein said further converter means includes pattern detection means for detecting patterns of said adaptive delta modulation signals to provide step size control signals, digital-to-analog converter means for providing exponentially related analog increment signals which correspond to an increment of the input analog voice signal represented by each of said adaptive delta modulation signals, an integrator for integrating each of said exponentially related analog increment signals into another analog signal, and means comparing said other analog signals with said voice signals from said input means for forming said adaptive delta modulation signals.

12. A telephone communication system as set forth in claim 11 wherein said digital-to-analog converter means includes means responsive to the algebraic sum of said digital signals from said pattern detection means for providing a digital signal to one of a plurality of discrete paths, each of which corresponds to a different total of said digital signals, and analog output means connected to said discrete paths for providing output analog signals which are exponentially related in response to the signal on any one of said paths.

13. A telephone communication system as set forth in claim 12 wherein said means responsive to the algebraic sum of said digital signals comprise a counter for counting a total of said digital signals, and means responsive to said count of said digital signals in said counter for providing said digital signal to said one of said paths corresponding to said total of said digital signals.

14. A telephone communication system as in claim 12 wherein said means responsive to the algebraic sum of said digital signals is a shift register having a plurality of signal bit places each connected to one of said discrete paths one unique, preset logic bit and means responsive to said digital signals from said digital means detecting patterns of said adaptive delta modulation signals for shifting said unique logic bit toward and away from a most significant one of said bit places for providing a signal over one of said discrete paths connected to the bit place then having said unique logic bit.

15. A telephone communication system as in claim 14 wherein said shift register additionally comprises means responsive to said unique bit in a most significant one of said bit places for preventing further shifting of said unique bit toward said most significant bit place and means responsive to said unique bit in a least significant one of said bit places for preventing further shifting of said unique bit away from said most significant bit place whereby said unique bit is prevented from overflowing from said shift register.

16. A telephone communication system as set forth in claim 12 wherein said analog output means comprises a constant current source, digital means responsive to said signal on said one of said discrete paths for providing time controlled digital signals and means connected to said constant current source and responsive to said time controlled digital signal for producing said output analog signals between said time controlled digital signals.

17. In a telephone communication system having a plurality of transmission lines over which voice signals are transmitted in an adaptive delta modulation code, the improvement comprising receiving means including a speed converter, input means for providing pulse code modulation signals to said speed converter, filter means connected to the output of said speed converter for smoothing the signals output therefrom, and digital converter means for converting the pulse code modulation signals output from said filter means to adaptive delta modulation signals for transmission over one of said transmission lines.

18. A telephone communication system as set forth in claim 17 wherein said digital converter means includes pattern detection means detecting predetermined patterns of said adaptive delta modulation signals to produce step size control signals, means responsive to said step size control signals for providing linear pulse code modulated signals represented by one of said adaptive delta modulation signals, and means comparing the last said linear pulse code modulation signals and said signals from said speed converter for providing said adaptive delta modulation signals.

19. A telephone communication system as set forth in claim 17 in which said receiving means additionally includes subscriber terminal means receiving said adaptive delta modulation signals over said transmission line and further converter means connected to said adaptive delta modulation signal input means for converting said input adaptive delta modulation signals to analog signals for output from said further converter means.

20. A telephone communication system as set forth in claim 17 in which said input means additionally includes further converter means for converting compressed pulse code modulation signals from said telephone system into linear pulse code modulation signals for use with said speed converter.

21. A telephone system as set forth in claim 20 wherein said further converter means includes pattern detection means detecting predetermined patterns of said adaptive delta modulation signals to produce step size control signals, digital to analog converter means, means responsive to said step size control signals for providing exponentially related analog increment signals which correspond to an increment of the input analog voice signals represented by each of said adaptive delta modulation signals, and an integrator for integrating each of said exponentially related analog increment signals into another analog signal.

22. A telephone communication system as set forth in claim 21 wherein said adaptive delta modulation signals have encoded logic states and wherein said pattern detection means includes means for providing digital signals discretely indicating identical and alternating logic states of consecutive ones of said adaptive delta modulation signals, means for counting said digital signals indicating said identical logic states of said consecutive adaptive delta modulation signals and for counting said digital signals indicating said alternating logic states of said consecutive adaptive delta modulation signals, bistable means for storing said step size control with states which indicate an increase or a decrease in an increment to said linear pulse code modulated signal represented by a last detected pattern of said adaptive delta modulation signals, and means responsive to the state of said bistable means and to preselected counts of said counted identical and alternating logic states of said consecutive adaptive delta modulation signal for providing said step size control signals.

23. A system as set forth in claim 21 wherein said adaptive delta modulation signals have encoded logic states and wherein said pattern detection means includes means connected to receive said adaptive delta modulation signals for providing digital signals discretely indicating identical and alternating logic states of consecutive ones of said adaptive delta modulation signals, and means responsive to a preselected number of said digital signals indicating said identical and alternating logic states of said consecutive adaptive delta modulation signals for providing said step size control signals.

24. A telephone communication system as set forth in claim 21 wherein said adaptive delta modulation signals have encoded logic states and wherein said pattern detection means includes meand detecting identical and alternating logic states of consecutive ones of said adaptive delta modulation signals.

25. A telephone communication system as set forth in claim 21 wherein said digitial to analog converter means includes means responsive to the total of said digital signals from said pattern detection means for providing a digital signal to one of discrete paths corresponding to said total of said digital signals, and means connected to said discrete paths for providing exponentially related analog signals in response to said signal on any one of said paths.

26. A telephone communication system as set forth in claim 21 wherein said means responsive to the total of said digital signals comprise a counter for counting a total of said digital signals, and means responsive to said count of said digital signals in said counter for providing said digital signal to said one of said paths corresponding to said total of said digital signals.

27. A telephone communications systems as in claim 21 wherein said means responsive to the total of said digital signals is a shift register having a plurality of signal bit places each connected to one of said discrete paths one unique preset logic bit and means responsive to said digital signals from said digital means detecting patterns of said adaptive delta modulation signals for shifting said unique logic bit toward and away from a most significant one of said bit places for providing a signal over one of said discrete paths connected to the bit place then having said unique logic bit.

28. A telephone communication system as in claim 27 wherein said shift register additionally comprises means responsive to said unique bit in a most significant one of said bit places for preventing further shifting of said unique bit toward said most significant bit place, and means responsive to said unique bit in a least significant one of said bit places for preventing further shifting of said unique bit away from said most significant bit place whereby said unique bit is prevented from overflowing from said shift register.

29. A telephone communication system as set forth in claim 21 wherein said digital to analog converter means comprises a consntant current source, digital means responsive to said signal on said one of said discrete paths for providing time controlled digital signals, and means connected to said constant current source and responsive to said time controlled digital signal for producing said output analog signals between said time controlled digital signals.

* * * * *